United States Patent
Schweitzer, III et al.

(10) Patent No.: US 11,067,617 B2
(45) Date of Patent: Jul. 20, 2021

(54) SINGLE-END TRAVELING WAVE FAULT LOCATION USING LINE-MOUNTED DEVICE

(71) Applicant: Schweitzer Engineering Laboratories, Inc., Pullman, WA (US)

(72) Inventors: Edmund O. Schweitzer, III, Pullman, WA (US); Raymond W. Rice, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 123 days.

(21) Appl. No.: 16/583,660

(22) Filed: Sep. 26, 2019

(65) Prior Publication Data

US 2020/0110124 A1    Apr. 9, 2020

Related U.S. Application Data

(60) Provisional application No. 62/742,871, filed on Oct. 8, 2018.

(51) Int. Cl.
    *G01R 31/08*    (2020.01)
    *G01R 31/11*    (2006.01)
    (Continued)

(52) U.S. Cl.
    CPC .......... *G01R 31/085* (2013.01); *G01R 31/088* (2013.01); *G01R 31/11* (2013.01); *G01R 19/2513* (2013.01); *G01R 31/58* (2020.01)

(58) Field of Classification Search
    CPC .... G01R 31/085; G01R 31/11; G01R 31/088; G01R 31/58; G01R 19/2513
    See application file for complete search history.

(56) References Cited

U.S. PATENT DOCUMENTS

| 3,585,298 A | 6/1971 | Liberman |
| 3,670,240 A | 6/1972 | Maranchak |

(Continued)

FOREIGN PATENT DOCUMENTS

| EP | 226210 | 12/1986 |
| EP | 241832 | 7/1990 |

(Continued)

OTHER PUBLICATIONS

D. Lei et al., "Novel Current Travelling Wave Based Single-end Fault Location Method for Locating Single-phase-to-ground Fault of Transmission Line"(2015) (Year: 2015).*

(Continued)

*Primary Examiner* — Tung X Nguyen
*Assistant Examiner* — Feba Pothen
(74) *Attorney, Agent, or Firm* — Richard M. Edge

(57) ABSTRACT

A line-mounted device is used to provide power system signals to a device for detecting a fault and calculating a fault location using a traveling wave launched thereby. Current at the line-mounted device is used to separate incident and reflected traveling waves at a terminal. Times and polarities of traveling waves passing the line-mounted device and the terminal are compared to determine if the fault is located between the terminal and line-mounted device or at a location beyond the terminal or line-mounted device. Voltage of the traveling wave may be calculated using currents from the line-mounted device.

25 Claims, 17 Drawing Sheets

(51) Int. Cl.
G01R 19/25 (2006.01)
G01R 31/58 (2020.01)

(56) References Cited

U.S. PATENT DOCUMENTS

| | | | |
|---|---|---|---|
| 3,753,086 | A | 8/1973 | Shoemaker |
| 3,878,460 | A | 4/1975 | Nimmersjö |
| 3,890,544 | A | 6/1975 | Chamia |
| 3,956,671 | A | 5/1976 | Nimmersjö |
| 4,053,816 | A | 10/1977 | Nimmersjö |
| 4,254,444 | A | 3/1981 | Eriksson |
| 4,296,452 | A | 10/1981 | Eriksson |
| 4,344,142 | A | 8/1982 | Diehr |
| 4,351,011 | A | 9/1982 | Liberman |
| 4,377,834 | A | 3/1983 | Eriksson |
| 4,499,417 | A | 2/1985 | Wright |
| 4,626,772 | A | 12/1986 | Michel |
| 4,766,549 | A | 8/1988 | Schweitzer |
| 4,797,805 | A | 1/1989 | Nimmersjö |
| 4,800,509 | A | 1/1989 | Nimmersjö |
| 5,198,746 | A | 3/1993 | Gyugyi |
| 5,272,439 | A | 12/1993 | Mashikian |
| 5,446,387 | A | 8/1995 | Eriksson |
| 5,572,138 | A | 11/1996 | Nimmersjö |
| 5,600,248 | A | 2/1997 | Westrom |
| 5,682,100 | A | 10/1997 | Rossi |
| 5,729,144 | A | 3/1998 | Cummins |
| 6,341,055 | B1 | 1/2002 | Guzman-Casillas |
| 6,417,791 | B1 | 7/2002 | Benmouyal |
| 6,477,475 | B1 | 11/2002 | Takaoka |
| 6,597,180 | B1 | 7/2003 | Takaoka |
| 6,798,211 | B1 | 9/2004 | Rockwell |
| 7,174,261 | B2 | 2/2007 | Gunn |
| 7,535,233 | B2 | 5/2009 | Kojovic |
| 7,714,735 | B2 | 5/2010 | Rockwell |
| 7,733,094 | B2 | 6/2010 | Bright |
| 8,315,827 | B2 | 11/2012 | Faybisovich |
| 8,525,522 | B2 | 9/2013 | Gong |
| 8,598,887 | B2 | 12/2013 | Bjorklund |
| 8,655,609 | B2 | 2/2014 | Schweitzer |
| 8,781,766 | B2 | 7/2014 | Schweitzer |
| 8,990,036 | B1 | 3/2015 | Schweitzer |
| 9,007,733 | B2 | 4/2015 | Wang |
| 9,470,748 | B2 | 10/2016 | Schweitzer |
| 9,594,112 | B2 | 3/2017 | Schweitzer |
| 9,627,881 | B2 | 4/2017 | Schweitzer |
| 10,295,585 | B2 | 5/2019 | Schweitzer |
| 10,302,690 | B2 | 5/2019 | Schweitzer |
| 2001/0012984 | A1 | 8/2001 | Adamiak |
| 2002/0118021 | A1 | 8/2002 | Saha |
| 2002/0165462 | A1 | 11/2002 | Westbrook |
| 2004/0189317 | A1 | 9/2004 | Borchert |
| 2004/0230387 | A1 | 11/2004 | Bechhoefer |
| 2005/0151659 | A1 | 7/2005 | Donovan |
| 2006/0012374 | A1 | 1/2006 | Kojovic |
| 2008/0077336 | A1 | 3/2008 | Fernandes |
| 2009/0230974 | A1 | 9/2009 | Kojovic |
| 2011/0058285 | A1 | 3/2011 | Wibben |
| 2011/0173496 | A1 | 7/2011 | Hosek |
| 2011/0227581 | A1 | 9/2011 | Kojovic |
| 2011/0264388 | A1 | 10/2011 | Gong |
| 2012/0086459 | A1 | 4/2012 | Kim |
| 2013/0021039 | A1 | 1/2013 | Bjorklund |
| 2013/0096854 | A1 | 4/2013 | Schweitzer |
| 2013/0100564 | A1 | 4/2013 | Zhang |
| 2013/0116944 | A1 | 5/2013 | Seibel |
| 2013/0241622 | A1 | 9/2013 | Zerbe |
| 2013/0265680 | A1* | 10/2013 | Smit ............... H02H 7/261 361/64 |
| 2014/0074414 | A1 | 3/2014 | Schweitzer, III |
| 2015/0081236 | A1 | 3/2015 | Schweitzer |
| 2016/0041216 | A1 | 2/2016 | Tang et al. |
| 2016/0077149 | A1 | 3/2016 | Schweitzer |
| 2016/0077150 | A1 | 3/2016 | Schweitzer |
| 2016/0084893 | A1 | 3/2016 | Schweitzer |
| 2016/0216310 | A1 | 7/2016 | Schweitzer |
| 2016/0266192 | A1 | 9/2016 | Burek |
| 2017/0012424 | A1 | 1/2017 | Schweitzer |
| 2017/0052222 | A1 | 2/2017 | Pasdar |
| 2017/0082675 | A1 | 3/2017 | Schweitzer |
| 2017/0102426 | A1 | 4/2017 | Schweitzer, III et al. |
| 2017/0146613 | A1 | 5/2017 | Schweitzer |
| 2017/0276718 | A1 | 9/2017 | Dzienis |
| 2018/0275188 | A1* | 9/2018 | Dzienis ............... G01R 31/086 |
| 2018/0364293 | A1* | 12/2018 | Li ............... G01R 31/08 |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

PCT/US2019/054029 Patent Cooperation Treaty, International Search Report and Written Opinion of the International Searching Authority, dated Jan. 2, 2020.

Harshad Mehta, Fault Location Techniques for High-Voltage DC Lines, EPRI EL-4331 Project 2150-1, 1985.

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs "Protective Relay Traveling Wave Fault Location", Presented at the 11th International Conference on Development in Power System Protection, Birmingham, United Kingdom, Apr. 2012.

Borghetti, et al, "On the use of continuous-wavelet transform for fault location in distribution power systems." International Journal of Electrical Power & Energy Systems. Nov. 2006.

Maher M.I. Hashim, Hew Wooi Ping, V.K. Ramachandaramurthy, Impedance-Based Fault Location Techniques for Transmission Lines, Sep. 2009.

Zheng et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

(56) References Cited

OTHER PUBLICATIONS

Edmund O. Schweitzer III, et AL "Locating Faults by the Traveling Waves They Launch", Presented at the 40th Annual Western Protective Relay Conference, Oct. 2013.

Toshio Tahagi, Jun-Ichi Baba, Katauhiko Usmura, Tishiaki Sakaguchi, Fault Protection Based on Travelling Wave Theory—Part I Theory, Jan. 24, 1977.

He, Baina, Yunwei Zhao, and Hengxu Ha. "A Novel Wave Based Differential Protection for Distributed Parameter Line." Telkomnika Indonesian Journal of Electrical Engineering Telkomnika 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

Edmund O. Schweitzer III, Bogdan Kasztenny "Distance Protection: Why Have We Started With a Circle, Does it Matter, and What Else is Out There?", Originally presented at the 44th Annual Western Protective Relay Conference, Oct. 2017.

\* cited by examiner

SINGLE-END TRAVELING WAVE FAULT LOCATION USING LINE-MOUNTED DEVICE

RELATED APPLICATION

This application claims benefit under 35 U.S.C. § 119(e) to U.S. provisional application Ser. No. 62/742,871 filed on 8 Oct. 2018 titled "Single-End Traveling Wave Fault Location Using Self-Powered Line-Mounted Device" naming Edmund O. Schweitzer III, Armando Guzman-Casillas, Mangapathirao Venkata Mynam, Veselin Skendzic, and Bogdan Z. Kasztenny as inventors, which is incorporated herein by reference in its entirety.

TECHNICAL FIELD

This disclosure relates to improvements to calculation of a fault location in an electric power delivery system. More particularly, this disclosure relates to a system for determining a fault location by detecting and differentiating between traveling wave instances and reflections at a single end of the electric power delivery system using signals from a line-mounted device.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1A:
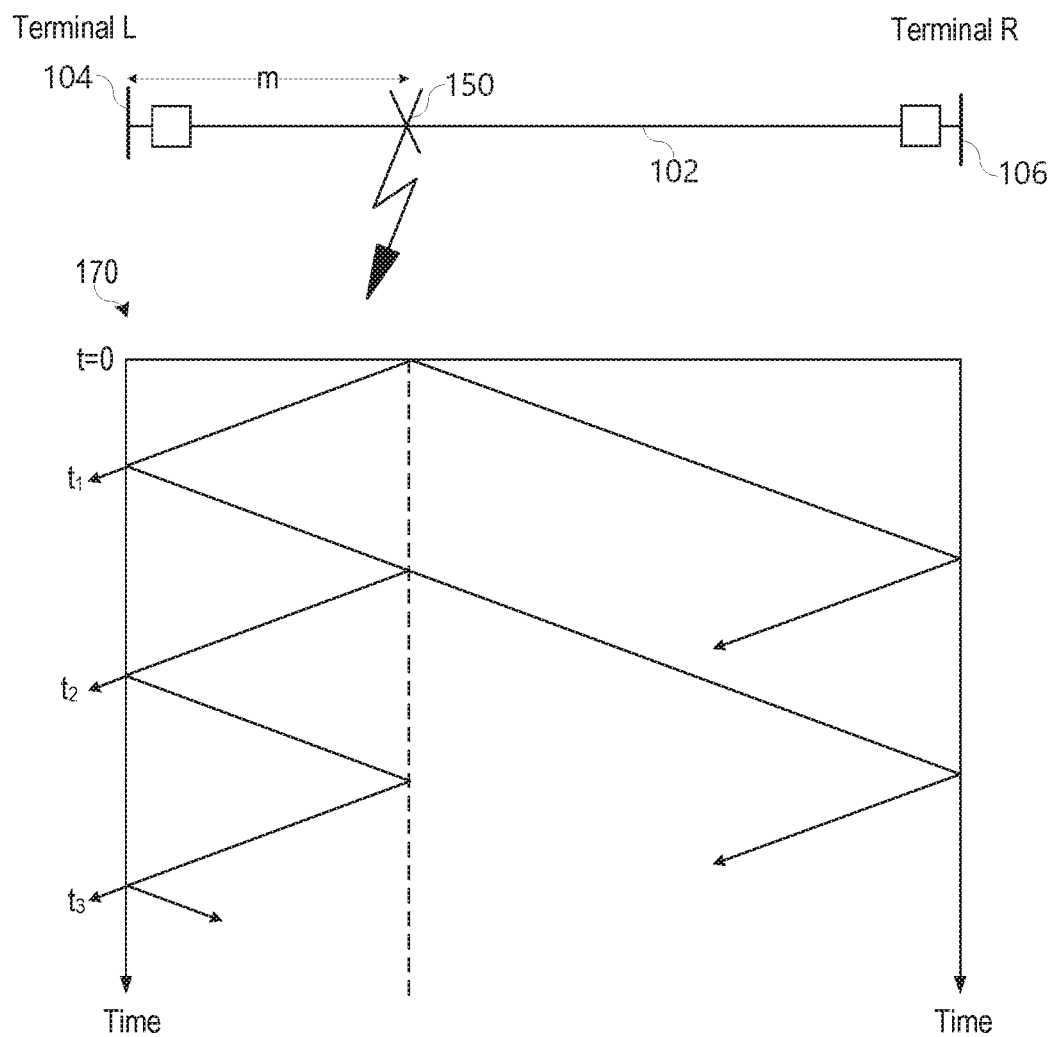
FIG. 1A illustrates a simplified one-line diagram and associated timing diagram of a traveling wave launched by a fault on an electric power delivery system.

The embodiments herein describe improvements to the technology of detecting and locating a fault on an electric power system. The improvements include use of a line-mounted device to provide power system information useful for differentiating between instances and reflections of traveling waves launched by a fault. The traveling waves at a single end of the power system may be used to detect the fault and determine a location of the fault using traveling wave principles.

A time between an incident traveling wave and a reflection from the fault location observed at a single end of a power line may be used to determine a fault location. Precise measurements of times of arrival of the traveling waves is needed to accurately calculate the location. At a terminal, the traveling wave voltage and current are measured as a sum of incident and reflected traveling waves. A determination of the traveling wave characteristics requires separating the incident and reflected wave. Separation of the incident and reflected traveling waves at a terminal has proven to be very difficult using existing instrument transformers. Further, in many installations the existing instrument transformers may not provide signals adequate to accurately distinguish between incident traveling waves and reflections from the fault location when the fault is close to the terminal. What is needed is a system for separating the incident and reflected traveling wave to provide an accurate traveling wave characteristic for fault detection. What is further needed is a system for distinguishing between incident traveling waves and reflections from the fault location even when the fault occurs near the terminal. Disclosed herein are devices and systems useful for detecting a fault and determining a fault location from traveling waves at a single end of a transmission line. The embodiments disclosed herein may make use of existing instrument transformers and a line-mounted device.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Several aspects of the embodiments described may be implemented as software modules or components. In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network.

FIG. 1A illustrates a timing diagram of incident and reflections of a traveling wave launched by a fault 150 on a line 102 of an electric power delivery system at time t=0. The fault 150 at a location of m from terminal 104 launches traveling waves in both directions. The waves propagate from the fault toward line terminals L 104 and R 106. Timing diagram 170 illustrates timing of the traveling wave propagation. The initial incident traveling wave reaches terminal L 104 at time $t_1$. A portion of the incident wave is reflected from the terminal L 104 back toward the fault location 150. A portion of the reflected wave reflects from the fault location 150, and reaches the terminal L 104 at time $t_2$. A similar reflection reaches the terminal L 104 at time $t_3$. With a known velocity of traveling wave propagation, a distance to the fault location 150 may be calculated using a time difference between the detected incident traveling wave $t_1$ and the reflection $t_2$. Accordingly, accurately detecting the traveling wave and reflections along with the times is needed for determining a fault location.

Figure 1B:
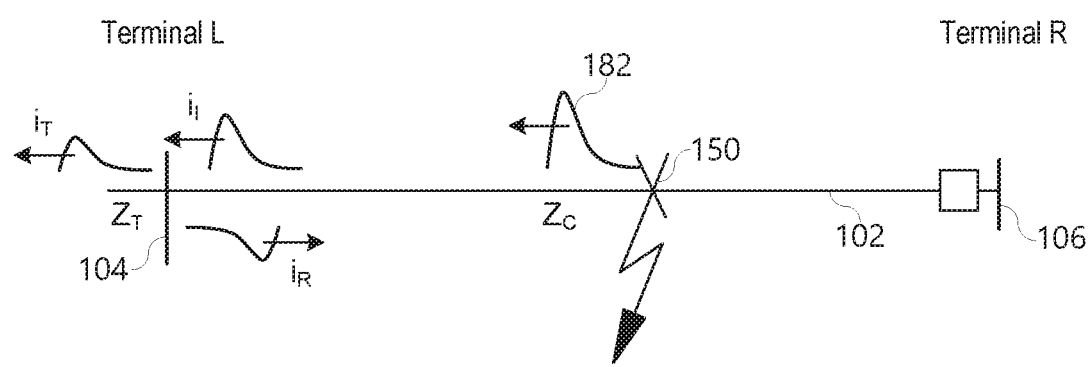
FIG. 1B illustrates a simplified one-line diagram including representations of incident, transmitted, and reflected portions of a traveling wave at one terminal.

FIG. 1B illustrates a portion of the one-line diagram of FIG. 1A with further details of the traveling wave. As indicated above, the fault 150 launches a traveling wave 182 toward Terminal L 104. The traveling wave 182 consists of a voltage and a current component, related by a characteristic impedance of the power line. When an incident traveling wave with a current $i_I$ and a voltage $v_I$ reaches a line terminal 104, a portion of the incident traveling wave is transmitted with current and voltage $i_T$ and $v_T$, and the remaining portion is reflected with current and voltage $i_R$ and $v_R$. The amount of energy that is transmitted and reflected depends on the characteristic impedance beyond the transition point $Z_T$ and the characteristic impedance $Z_C$ of the line the wave traveled. A device at the line terminal measures current and voltage values that are the sum of the incident and reflected traveling waves. The fidelity of the measured voltage value may be low in the frequency of interest for traveling waves, especially when the voltage measurement is made via a capacitively-coupled voltage transformer (CCVT). If the voltage could be accurately measured, the device at the line terminal could accurately calculate incident and reflected traveling waves.

Because the device is only able to measure v and i, and because the voltage measurement is distorted by the CCVT, the device cannot accurately calculate incident and reflected waves, and this limitation degrades the ability to accurately calculate fault location.

Equations 1 and 2 illustrate the terminal voltage v and terminal current i as functions of incident and reflected voltages $v_I$, $v_R$ and incident and reflected currents $i_I$, $i_R$:

$$v = v_I + v_R \qquad \text{Eq. 1}$$

$$i = i_I + i_R \qquad \text{Eq. 2}$$

Further, Equations 3 and 4 illustrate i in terms of $v_I$ and $v_R$, and solve for $v_R$:

$$i = \frac{v_I}{Z_C} - \frac{v_R}{Z_C} \qquad \text{Eq. 3}$$

$$v_R = v_I - iZ_C \qquad \text{Eq. 4}$$

Substituting $v_R$ from Equation 4 into Equation 2A and solving for $v_I$ results in Equation 5:

$$v_I = \frac{v + iZ_C}{2} \qquad \text{Eq. 5}$$

Similarly, Equation 6 is obtained to express the voltage of the reflected wave at the line terminal as a function of v and i:

$$v_R = \frac{v - iZ_C}{2} \qquad \text{Eq. 6}$$

Equations 5 and 6 are performed on modal currents and voltages using the corresponding characteristic impedance of the line. The challenge in separating the incident and reflected traveling waves is proper measurement of voltages and currents at the terminal. As discussed above, high-fidelity voltage and current measurements at a single line end are, therefore, important to differentiate between incident and reflected traveling waves. Typical instrument transformers such as CTs and PTs (e.g. CCVTs) are optimized for use under nominal frequency conditions. Traveling wave signals exhibit at a much higher frequency than typical nominal frequencies of electric power delivery systems. Specialized high-frequency transducers may be used, but the high cost and custom nature of these devices make this approach impractical for typical power system installations. Furthermore, typically power system installations already have installed instrument transformers. Voltages are often measured using CCVTs which are tuned to the nominal signal frequency and show a very large attenuation for higher frequencies such as in the kHz and MHz range. CCVTs are not generally suitable for traveling wave measurement using their standard secondary voltage outputs. Conventional CTs have a good high-frequency response, where the usable passband typically reaches 100 kHz and may even be closer to 200 kHz or 500 kHz.

Thus, a first problem is discerning between incident and reflected traveling waves with a device near the terminal for fault detection and location calculation. What is needed is a system to separate such incident and reflected traveling waves, even when using existing instrument transformers at the terminal.

Figure 1C:
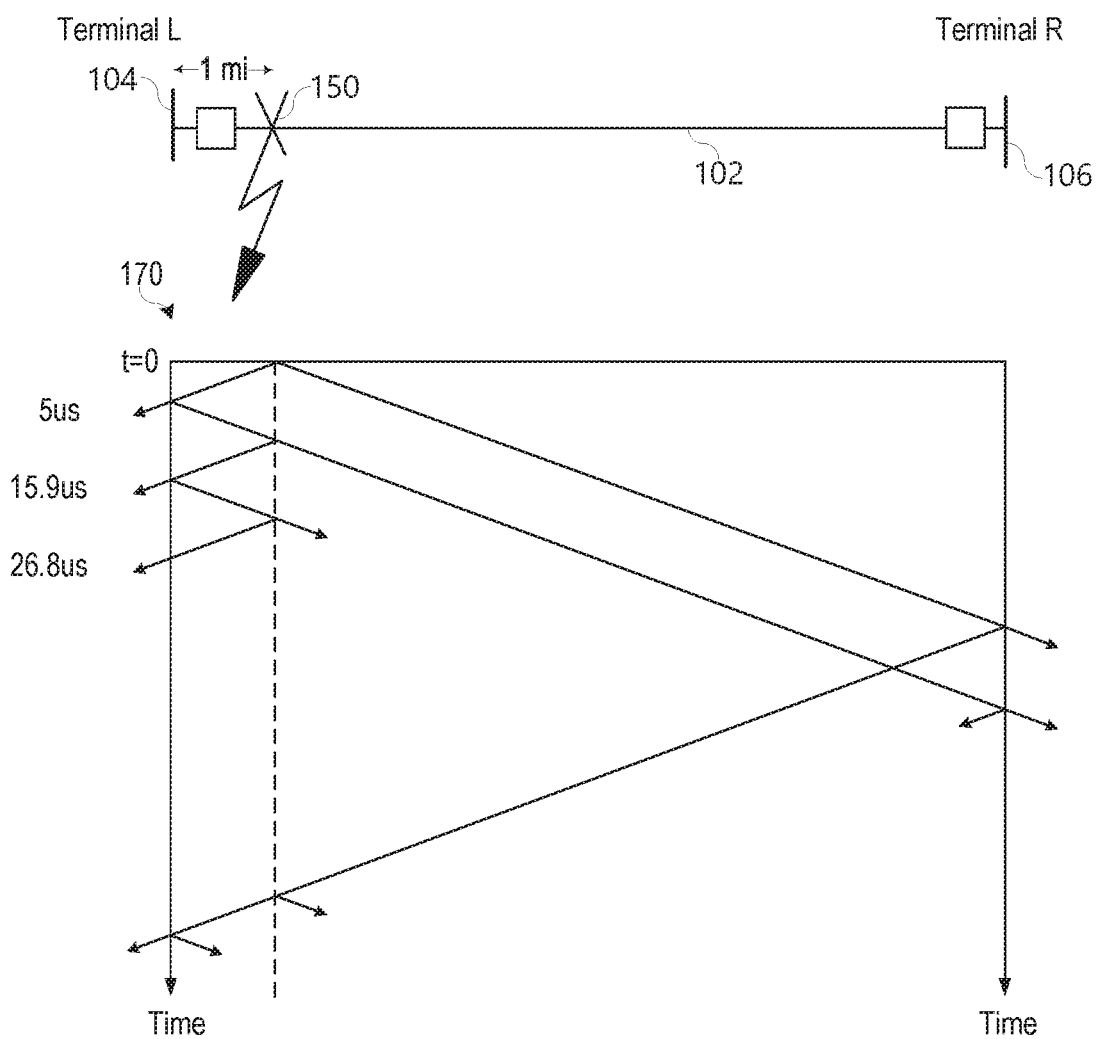
FIG. 1C illustrates a traveling wave timing diagram of a fault near a terminal of an electric power delivery system.

FIG. 1C illustrates another timing diagram of incident and reflected traveling waves launched by a fault 150. In this illustrated diagram, the fault 150 is a close-in fault, occurring only 1 mile from the terminal L 104. Using a known traveling wave propagation velocity, it can be seen that the time between the initial arrival of the incident traveling wave (at 5 μs from the time of the fault) and the time of arrival of a portion of the traveling wave reflected from the fault location (at 15.9 μs from the time of the fault) is less than 11 μs. Faults occurring even closer to the line terminal result in even shorter time differences between arrival of the incident traveling wave and reflections from the fault. These time differences may approach the sampling resolution of the device tasked with detecting the fault and determining the fault location. Accordingly, the instrument transformers may blur the initial traveling wave and the reflection from the fault. Thus, a second problem is discerning between incident traveling waves and reflections from the fault when the fault is close to the terminal. What is needed is a system to separate such incident traveling waves and reflections from the fault.

Figure 2:
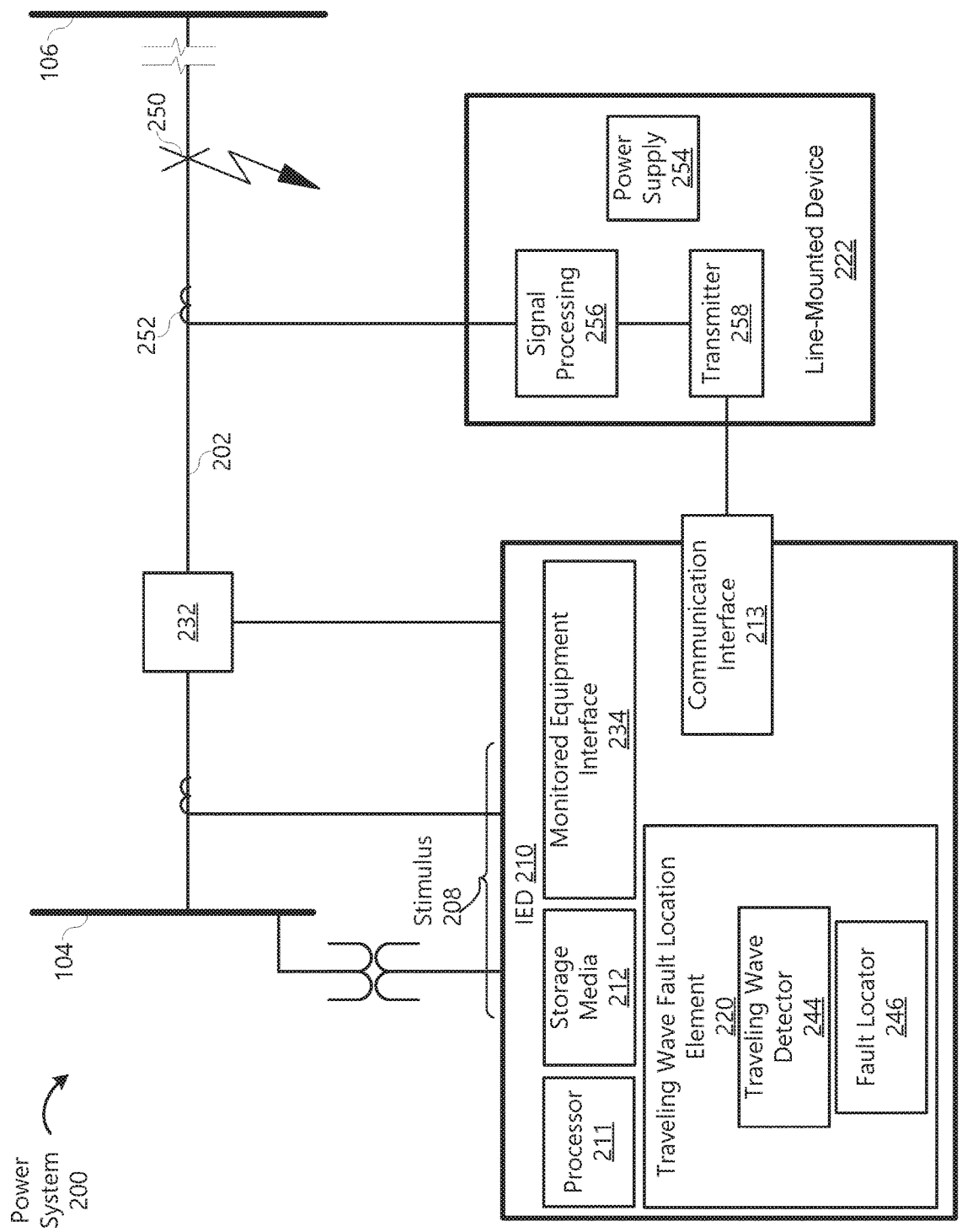
FIG. 2 illustrates a simplified one-line diagram of an electric power delivery system monitored and protected using an intelligent electronic device (IED) and a line-mounted device in accordance with several embodiments described herein.

FIG. 2 illustrates a simplified one-line diagram of an electric power delivery system 200 monitored by an IED 210 that provides fault detection and location in accordance with several embodiments herein. The IED 210 may detect faults and calculate fault locations with traveling wave principles, using signals from instrument transformers that are already in service for traditional line monitoring and protection. IED 210 may include a processor 211, which may comprise one or more general purpose processors, special purposes processors, application-specific integrated circuits, programmable logic elements (e.g., FPGAs), or the like. The IED 210 may further comprise non-transitory machine-readable storage media 212, of one or more disks, solid-state storage (e.g., Flash memory), optical media, or the like. The IED 210 may be in communication with a network (not separately illustrated) that may include special-purpose networks for monitoring and/or controlling the electrical power system 200 (e.g., SCADA networks, or the like). In some embodiments, the IED 210 may include human-machine interface (HMI) components (not shown), such as a display, input devices, and the like.

The IED 210 may further comprise one or more communication interfaces 213. The communication interface 213 may include wired and/or wireless communication interfaces (e.g., serial ports, RJ-45, IEEE 802.11 wireless network transceivers, fiber-optic transceivers, etc.) for communicating with a line-mounted device 222.

The IED 210 may be communicatively coupled to the power system 200 through one or more CTs, PTs (which may be implemented as a CCVT or the like), merging units, or the like. The IED 210 may receive stimulus 208 from the power system 200 in the form of electrical signals related to current, electrical signals related to voltage, digitized analog signals related to current and/or voltage, and the like.

The IED 210 may include a plurality of protection elements such as a traveling wave fault location element 220 that may be embodied as instructions stored on computer-readable media (such as storage media 212) that, when executed on the processor 211, cause the IED 210 to detect one or more incidents of traveling wave and calculate a location of the fault. Fault location calculation may be based on the times of the traveling waves. The traveling wave fault location element 220 may include instructions for a traveling wave detector 244, and a fault locator 246 configured to determine a fault location. Upon detection of a fault within a predetermined zone of protection, the IED 210 may further include instructions for taking a protective action such as signaling a circuit breaker 232 to open, removing electric power from being fed to the fault. The protective action may be taken to prevent additional damage to the power system. Further, a calculated location of the fault is helpful for work crews to travel to the location and repair damaged equipment.

The traveling wave detector 244 may detect traveling wave instances and reflections using voltage and/or current signals. The time of the traveling wave may be based on the time that the signals were obtained from the electric power delivery system. The traveling wave detector 244 may also determine the polarity of the traveling wave detected. The fault locator 246 may use information related to a traveling wave from the traveling wave detector and information related to a traveling wave using signals obtained using a line-mounted device to calculate a location of the fault. The line-mounted device 222 may provide processed traveling wave information (e.g. traveling wave times and polarities) or raw information from the electric power delivery system for processing by IED 210, or combinations thereof.

Furthermore, the IED 210 may include a monitored equipment interface 234 in electrical communication with a piece of monitored equipment such as circuit breaker 232. The monitored equipment interface 234 may include hardware for providing a signal to the circuit breaker 232 to open and/or close in response to a command from the IED 210. For example, upon detection of a fault, the traveling wave element 220 may signal the monitored equipment interface 234 to provide an open signal to the circuit breaker 232, thus effecting a protective action on the electric power delivery system. In certain embodiments, the protective action may be effected by additional or separate devices such as a merging unit.

As mentioned above, a time difference between a traveling wave instance and a reflection from the fault location may be used to calculate a distance to the fault. A fault location from a single end may be calculated using Equation 7:

$$m = \left(\frac{t_{L2} - t_{L1}}{2}\right) * v_{TW} \qquad \text{Eq. 7}$$

where:
  m is a distance to the fault;
  $t_{L2}$ is the arrival time of the first reflection from the fault at the L Terminal;
  $t_{L1}$ is the arrival time of the initial wave front from the fault at the L Terminal; and,
  $v_{TW}$ is the traveling wave propagation speed;

In order to solve for the two problems introduced above, the improvements herein use the line-mounted device 222. The line-mounted device 222 may be installed at a predetermined location on the line 202 to provide signals to facilitate determination of a fault location. The IED 210 may be in communication with the line-mounted device 222 for receiving information related to the electric power delivery system at the location of the line-mounted device 222. In several embodiments, the line-mounted device 222 is used to provide a measurement of the incident current $i_I$ of the traveling wave. With a known impedance $Z_C$, the incident voltage $v_I$ of the traveling wave may be calculated in accordance with Equation 5. Thus, the incident voltage $v_I$ may be determined and reflections from the fault may be used to calculate fault location, regardless of any inability to measure traveling wave incident voltage and current at the terminal.

The line-mounted device 222 may include a power supply 254 for providing electric power to the several components of the line-mounted device 222. The power supply may obtain electric power from the power system 200, from an internal power source, or the like as described in more detail herein. The line-mounted device 222 may include a signal processing module 256 in communication with a current transformer 252 to obtain current signals therefrom and process the signals for transmission to the IED 210 via a transmitter 258. The signal processing module 256 may provide modulated analog signals for transmission, digitized signals for transmission, or the like as disclosed in more detail herein.

The line-mounted device 222 may be used to provide signals related to a traveling wave passing by the location of the line-mounted device 222 for use by the traveling wave fault location element 220 of the IED 210. In certain embodiments, the location of the line-mounted device 222 may be outside of a zone of resolution of the CCVT. For example, if the minimum time for resolution is on the order of 10 µs, the line-mounted sensor may be placed at around one mile from the terminal where the CCVT is located. The line-mounted device 222 detects the wavefront of the traveling wave passing the line-mounted device and its polarity; and sends information related thereto to the IED 210 for determining a fault location using traveling waves.

Signals from the line-mounted device 222 may be used by the traveling wave fault location element 220 to separate incident and reflected traveling waves. That is, the traveling wave current measured using the line-mounted device 222 may be useful for determining a traveling wave voltage (using known system impedance). That is, the IED 210 may calculate the incident traveling wave voltage using the current from the line-mounted device multiplied by the impedance. Thus, the voltage of the incident traveling wave may be calculated using a current from the line-mounted device, avoiding the need to separate the incident and measured traveling wave voltages at the terminal. According to this improvement, high-fidelity voltage measurements at the IED are not needed to separate the incident and reflected traveling waves.

Furthermore, a line-mounted device as disclosed may be useful to determine whether the fault is: 1) between the terminal and the line-mounted device; 2) beyond the line-mounted device; or 3) on another conductor. This determination is based on the relative times of arrival of the traveling wave at the terminal and the line-mounted device, and the polarities of the traveling waves at the terminal and the line-mounted device. The IED may take or block a protective action depending on the determined location of the fault.

Figure 3:
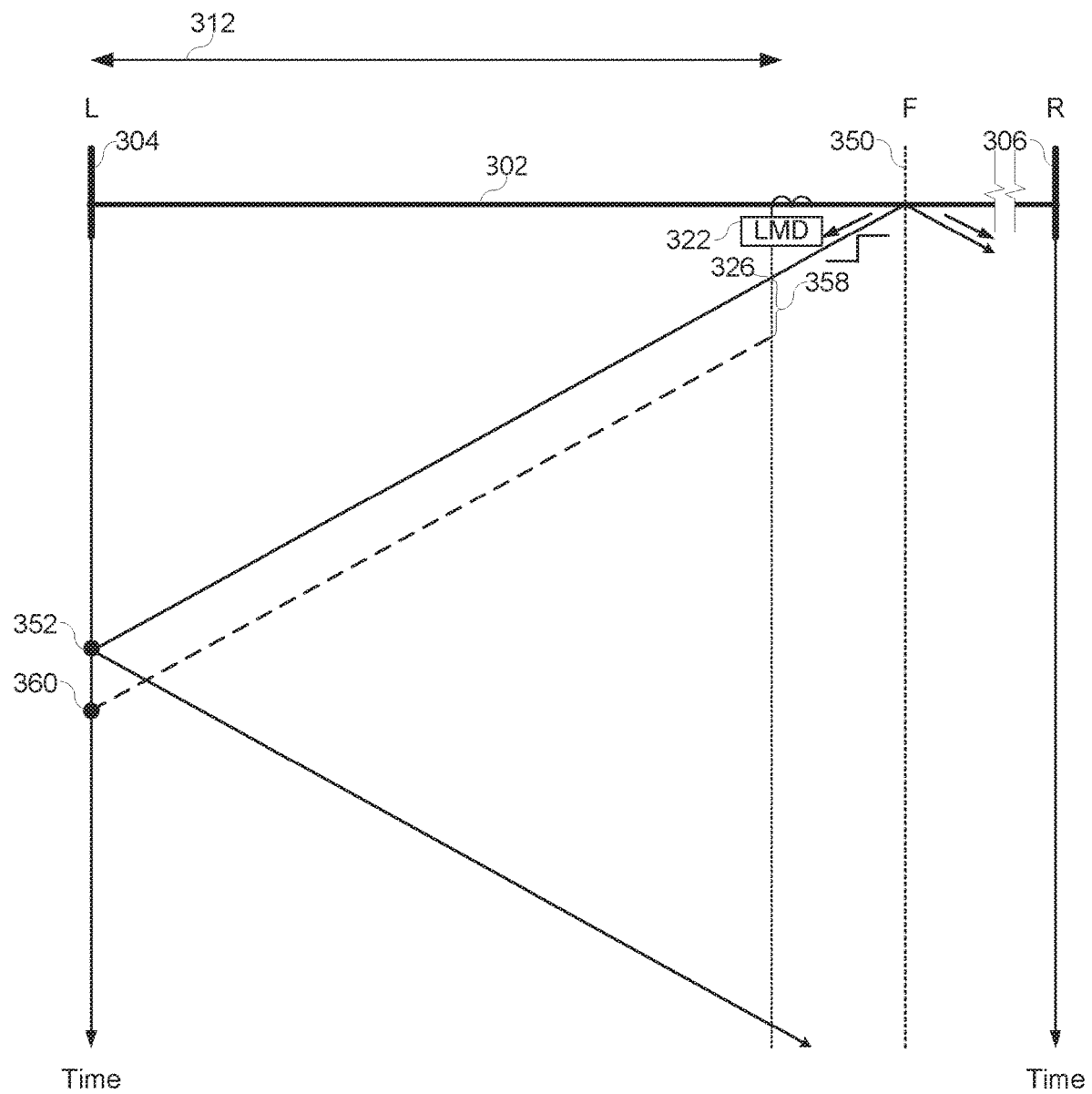
FIG. 3 illustrates a one-line diagram of an electric power delivery system with a fault and a timing diagram of a traveling wave launched by the fault.

FIG. 3 illustrates a simplified one-line diagram of an electric power system monitored using a line-mounted device 322 and a timing diagram of traveling waves and reflections instigated by the fault 350. The system includes a remote terminal R 306, local terminal L 304 and power line 302, which may be monitored by an IED (such as the IED 210) to obtain electric power system signals and determine a fault condition and fault location using traveling wave principles. Furthermore, the line-mounted device 322 is at a known distance 312 from terminal L 304. The known distance 312 may be determined as a distance needed for useful resolution of voltage signals from existing equipment. The line-mounted device 322 obtains power system measurements, such as current, from the line 302 and transmits information related thereto to the IED. In certain embodiments, the line-mounted device 322 may transmit current measurements to the IED. In other embodiments, the line-mounted device 322 may calculate traveling wave properties (such as, for example, time, voltage, polarity, and the like), and transmit information related to the traveling wave properties to the IED. The IED may use information from the line-mounted device 322 and information obtained by the IED to determine a location of the fault 350.

The incident traveling wave of the first polarity reaches the line-mounted device 322 at time 326 and reaches the L terminal 304 at time 352. The line-mounted device 322 may measure the current of the incident traveling wave at the location of the line-mounted device 322. In certain embodiments, the line-mounted device may calculate an incident traveling wave voltage as the product of the characteristic impedance $Z_C$ and the current measured at the line-mounted device 322. In still other embodiments, the voltage at the line-mounted device may be calculated at the IED using the current measured by the line-mounted device and communicated to the IED. After a known time 358 (which may be near zero in various embodiments, or may be related to a processing time in certain embodiments), the line-mounted device 322 transmits the traveling wave information or the current measurements to the IED, arriving at the IED at time 360.

Upon arrival of the incident traveling wave at the terminal at 352, the IED may calculate traveling wave properties. With the fault 350 occurring beyond the line-mounted device 322 (not within zone 312), the incident wave detected using measurements from the line-mounted device 322 and the incident wave detected using the voltages and currents at terminal L 304 will have the same polarity. Accordingly, the IED may determine that the fault is outside of zone 312. The IED may use the calculated voltage using the current measured at the line-mounted device and the characteristic impedance to determine the incident voltage wave.

Accordingly, it may be determined that that the fault is outside of zone 312 (due to the time of arrival of the incident traveling wave at the line-mounted device before arrival at the terminal, and the incident traveling wave at the line-mounted device being the same polarity as the incident traveling wave at the terminal). Traveling wave incident current $i_I$ as measured at the line-mounted device 322 may be used to calculate traveling wave incident voltage $v_I$. Measurements from the line-mounted device 322 may be used by the IED to separate the incident traveling wave from the reflections from the fault location. The IED may use such time difference to calculate a distance to the fault using the time of the initial wavefront and the reflection(s) from the fault location.

In certain embodiments, the line-mounted device 322 may transmit current measurements only, and IED may calculate the incident wave voltage using at the line-mounted device using those measurements and the system impedance. In other embodiments, the line-mounted device 322 may calculate and transmit to the IED information regarding the incident traveling wave such as, for example, time of detection of the incident traveling wave, current measurements, voltage measurements, voltage calculations, polarity, and the like. The communication from the line-mounted device 322 arrives at the IED at time 360.

The IED may include a setting of the delay 358 and communication travel time from the line-mounted device 322, such that the received measurements or calculations at time 360 may be aligned with measurements or calculations made at time 352 for proper comparison.

Figure 4:
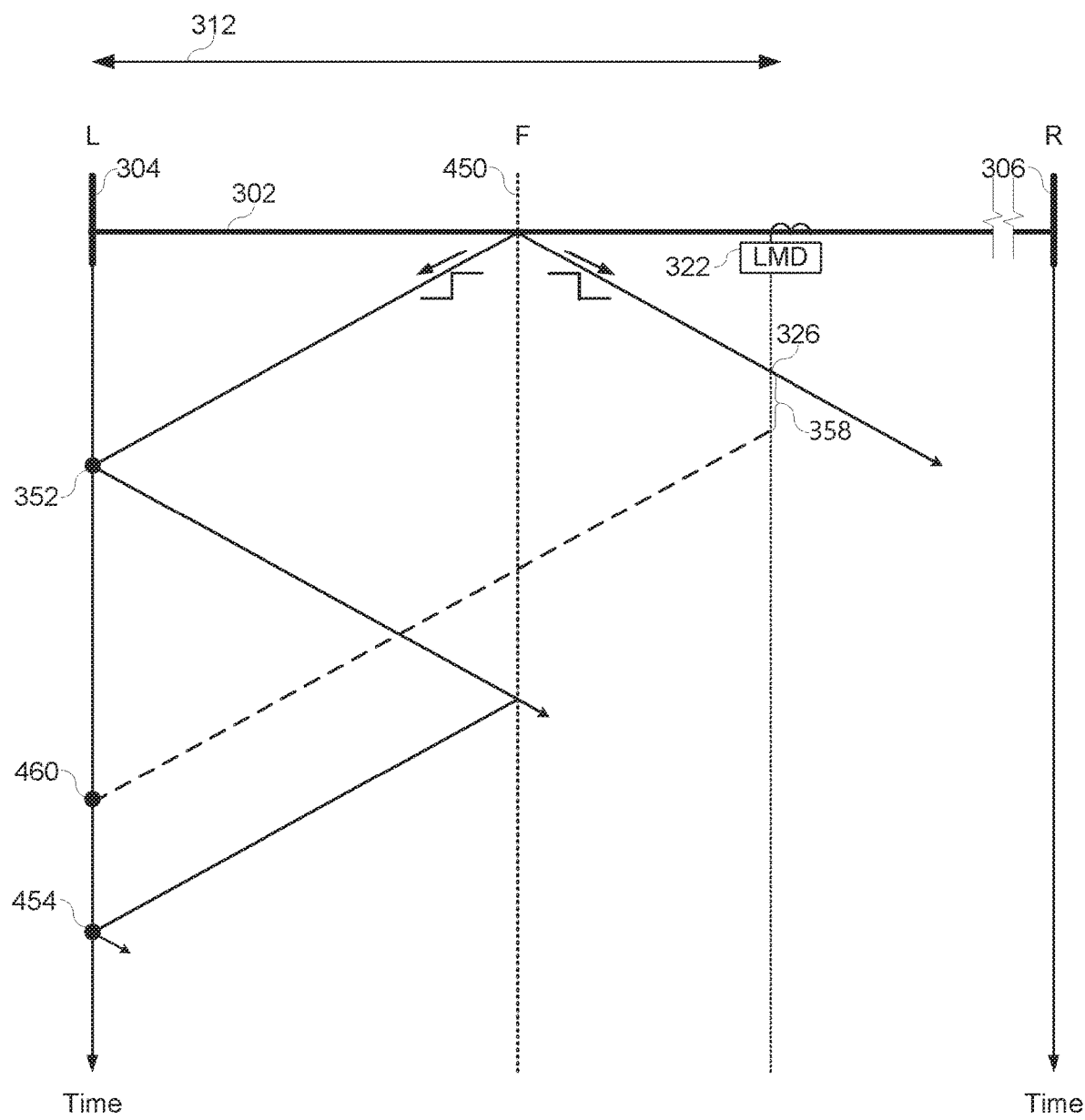
FIG. 4 illustrates a one-line diagram of an electric power delivery system with a fault at a different location than the fault of FIG. 3, and a timing diagram of traveling waves launched by the fault.

FIG. 4 illustrates the simplified one-line diagram of FIG. 3, but with the fault 450 at a location between the terminal L 304 and the line-mounted device 322 (within zone 312). The fault 450 launches a traveling wave towards terminal L 304, and a traveling wave toward line-mounted device 322. Traveling wave fronts arrive at the line-mounted device 322 at time 326 and at terminal L 304 at time 352. Traveling wave information collected at the line-mounted device is sent at time 358 and arrives at the IED at time 460. The traveling wave at the line-mounted device and the traveling wave at the terminal L 304 exhibit opposite polarity. Accordingly, the IED may determine that the fault 450 is between terminal L 304 and the line-mounted device 322. Further, the resolution of the CCVT will be insufficient for the IED to separate the incident traveling wave 352 from a reflection from the fault 454. However, because the IED determined that the fault is within zone 312, the IED may determine to take a protective action for the close-in fault.

Furthermore, the IED may determine a fault location using a time of arrival 352 of the incident traveling wave at the IED, and the time of arrival 326 of the incident traveling wave at the line-mounted device 322. The time of arrival 326 of the incident traveling wave at the line-mounted device 322 may be calculated by subtracting the processing time 358 and the communication time from the time of receipt 460 of the communication from the line-mounted device 322. The fault location between the terminal L 304 and the line-mounted device 322 represented as the distance M of the fault 450 from the terminal L 304 may be calculated in accordance with Equation 8:

$$M = \frac{SL}{2}\left(1 + \frac{t_L - t_{LMD}}{v_{TW}}\right) \quad \text{Eq. 8}$$

where:

SL is a segment length 312 between terminal L 304 and the line-mounted device 322;

$t_L$ is the time of arrival 352 of the traveling wave front at the terminal L 304; and, $t_{LMD}$ is the time of arrival 326 of the traveling wave front at the line-mounted device, as reported by the line-mounted device or calculated using the processing and communication delays.

As illustrated in FIGS. 3 and 4, the polarity of the incident traveling wave using measurements observed at a line-mounted device 322 may be compared with the polarity of the incident traveling wave observed at terminal L 304. When the polarities are the same, then it may be concluded that the fault is outside of zone 312. Voltage measurements from a CCVT at terminal L 304 may be used to separate the incident traveling wave and a reflection from the fault. The time between the incident traveling wave and the reflection from the fault may be used to calculate a distance to the fault. When the polarities are opposite, it may be concluded that the fault is within zone 312, and voltages obtained by a CCVT at terminal L 304 may not be used to separate an incident traveling wave and a reflection from the fault for use in a calculation of a fault location. However, because it is known that the fault is close to the terminal, a protective action may be taken.

Figure 5:
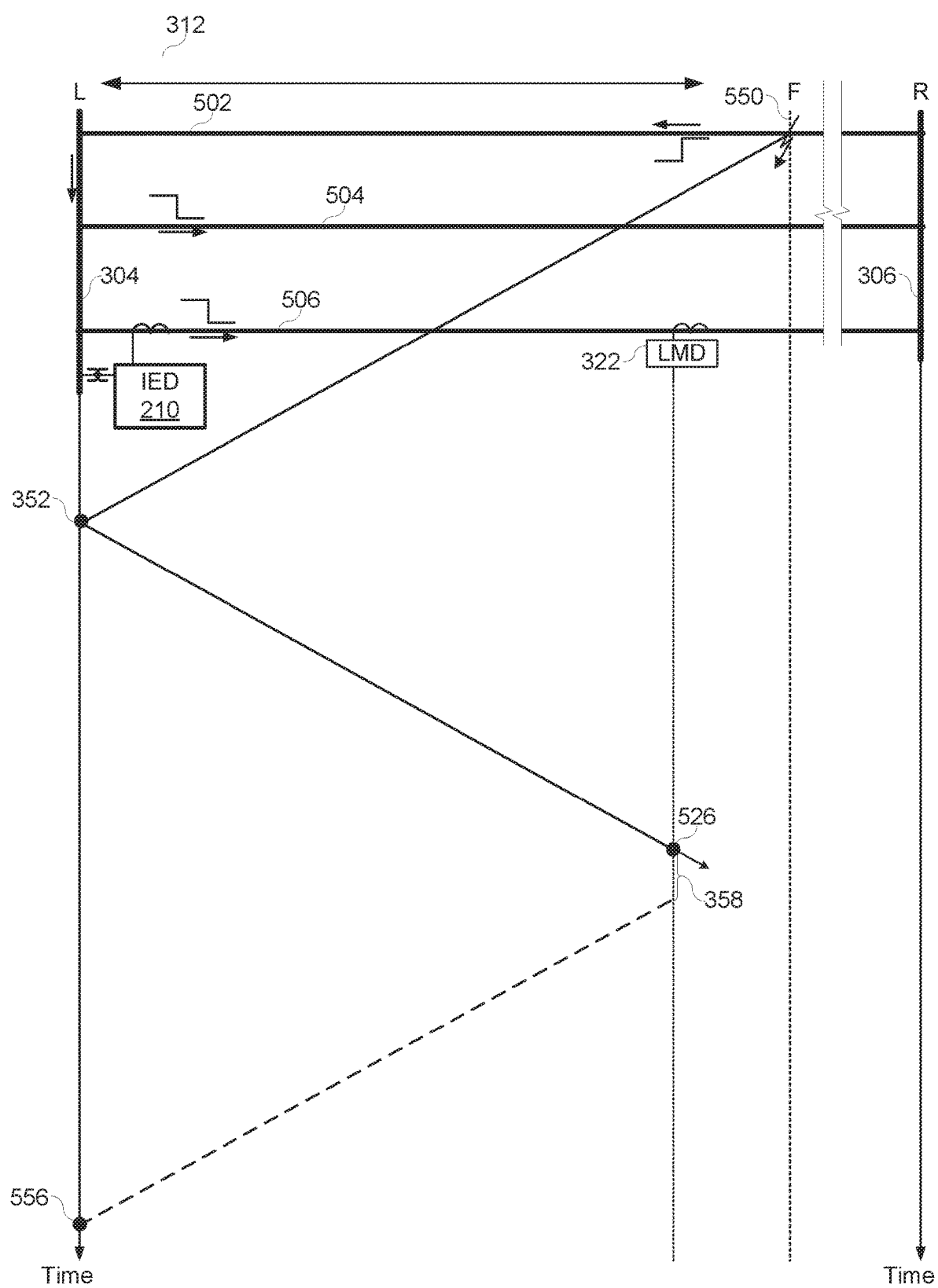
FIG. 5 illustrates a one-line diagram of an electric power delivery system with a fault and a timing diagram of traveling waves launched by the fault.

FIG. 5 illustrates yet another simplified diagram of an electric power delivery system that include three lines 502, 504, 506. Each line may be single conductors, or comprise multiple conductors per line. For this illustrated example, the IED 210 is monitoring and protecting line 506, where other IEDs (not illustrated) may be used to monitor and protect the other lines and equipment. Fault 550 occurs on line 502. The traveling wave launched thereby travels through terminal L 304 to the other lines 504, 506. The lines 502, 504, 506 may be parallel lines as illustrated, radial lines, transmission lines to different substations, or the like. An incident traveling wave launched by fault 550 on line 502 is detected by the IED 210 at time 352. After propagation of the traveling wave, line-mounted device 322 transmits traveling wave information at time 526, which arrives at the IED at time 556. As above, the polarities of the traveling wave detected by the IED 210 and the traveling wave arriving at the line-mounted device 322 are compared by the IED. Because the traveling wave at the IED 210 and at the line-mounted device 322 are of the same polarity, and it is determined that the traveling wave is not between the terminal L 304 and the line-mounted device 322. Further, because the traveling wave arrived at terminal L 304 before arrival at line-mounted device 322, the IED determines that the fault occurred behind the terminal 304 (not between terminal 304 and line-mounted device 322, nor between line-mounted device 322 and remote terminal R 306). Accordingly, the IED may block protection actions for line 506 due to the location of the fault on line 502.

Figure 6:
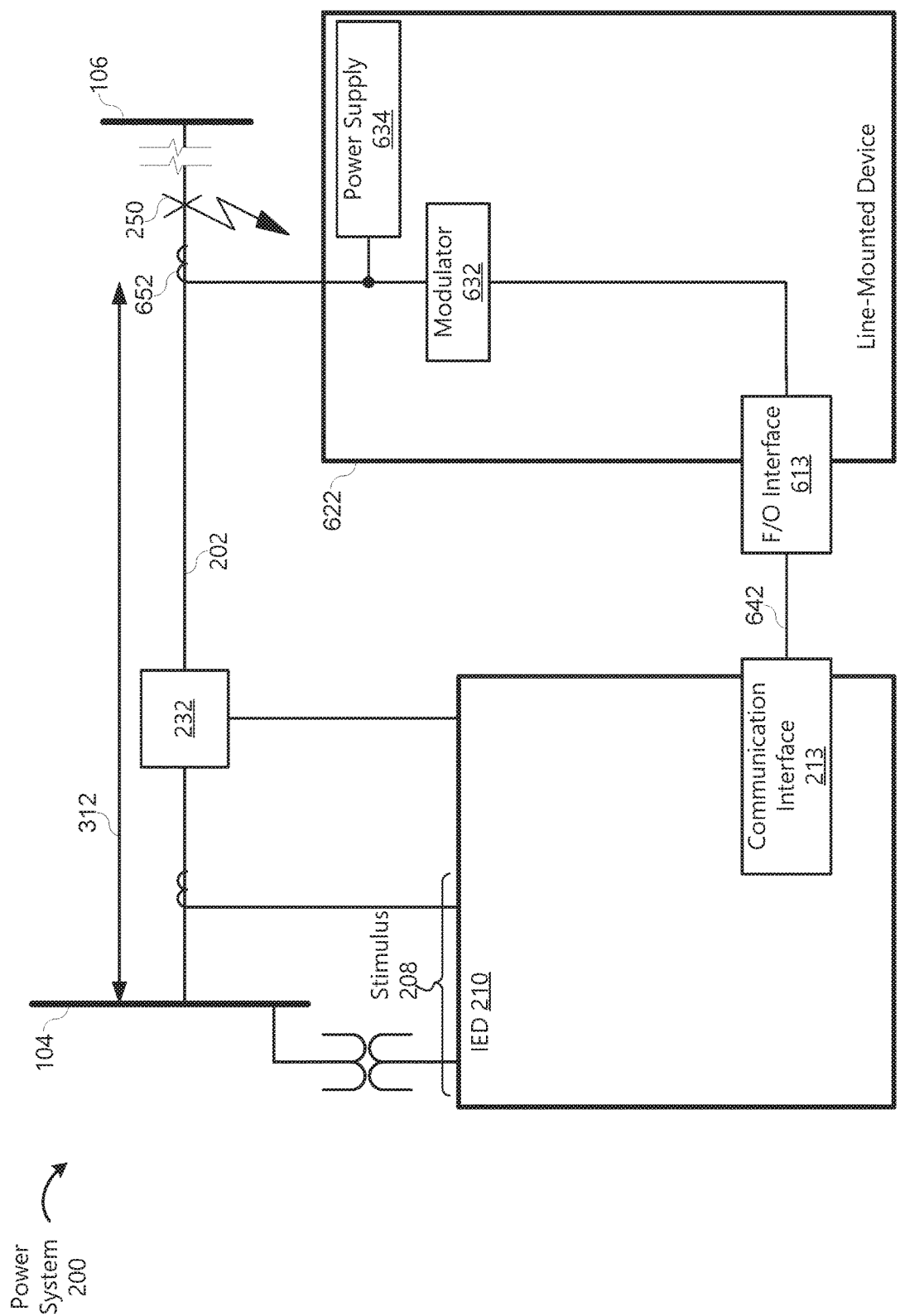
FIG. 6 illustrates a simplified block diagram of a system for locating a fault using signals from an IED and an analog line-mounted device.

FIGS. 6-12 generally illustrate different embodiments of line-mounted devices useful for providing signals to the IED for fault detection and location calculation using traveling wave principles as described herein. FIG. 6 illustrates a simplified block diagram of a line-mounted device 622 in communication with IED 210. Line-mounted device 622 may be powered using a power supply 634. In various embodiments, the power supply 634 may receive electrical power from the line 202 via CT 652 or a separate CT for obtaining electric power from the power system. The power supply 634 may condition and supply power for use by various of the elements of the line-mounted device. In some embodiments, the power supply may obtain electric power using a battery, capacitor, or intermittent power sources (e.g. solar).

CT 652 may provide current secondary signals to modulator 632 configured to control a signal provided on a fiber-optic interface 613 using the current secondary signals. As used herein, "modulator," "modulation," and the like may refer to any modification of a signal to represent the current including, for example, changing a carrier signal (e.g. changing a frequency, amplitude, or the like) or changing a communication signal to be a direct representation of the signal. Fiber optic interface 613 may provide an optical signal corresponding to the modulated current signal on optical fiber media 642. The optical fiber media 642 may be a dedicated fiber between the line-mounted device 622 and IED 210. The optical media 642 may be a dedicated media, or may be an optical ground-fiber (e.g. optical ground wire, "OPGW") already existing in the electrical power system. IED 210 may be configured to determine the fault location in accordance with the several embodiments described hereinabove using the modulated signal. Specifically, the IED 210 may obtain local current and/or voltage signals using stimulus 104 to determine a traveling wave occurrence, time, and polarity, and may receive current information from the line-mounted device 622 using communication interface 213 to determine traveling wave occurrence, time, and/or polarity at the position of the line-mounted device 622. Using the traveling wave information at the terminal and at the location of the line-mounted device, the IED 210 may be configured to determine if the fault is within the zone 312 (opposite polarity) outside of the zone 312 on the same line (same polarity, traveling wave arrival at line-mounted device before arrival at the terminal), or outside of the zone 312 on a different line (same polarity, traveling wave arrival at terminal before arrival at line-mounted device) using the techniques described herein.

IED 210 may have stored a predetermined time delay of the line-mounted device 622 related to the time of processing and communication on the media 642. The predetermined time delay may be relatively constant. The predetermined time delay may be tested based on a test of the line-mounted device, a length of the fiber optic media 642, and a known propagation speed of light through the fiber optic media 642. The IED 210 may use the predetermined time delay to calculate a time that the traveling wave passed the CT 652 of the line-mounted device 622.

Figure 7:
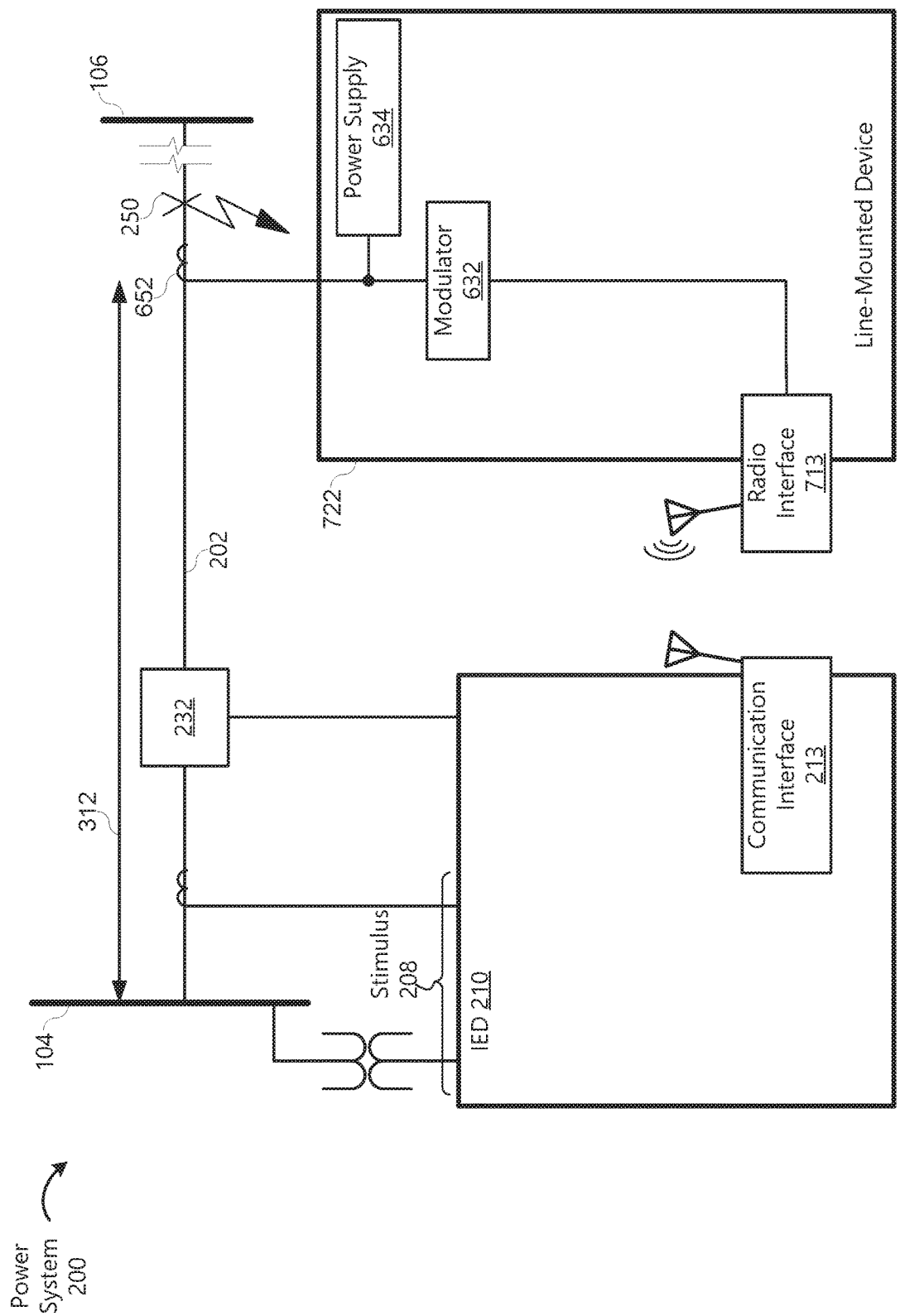
FIG. 7 illustrates a simplified block diagram of a system for locating a fault using signals from an IED and an analog line-mounted device.

FIG. 7 illustrates a simplified block diagram of a line-mounted device 722 in communication with IED 210 similar to the system described in FIG. 6, using radio-frequency communication system. The CT 652 in communication with a modulator 632 configured to modulate a radio interface 713. Radio interface 713 provides a radio signal corresponding to the modulated current signal using appropriate media. The modulated current signal is provided for use by the IED 210 as described above.

Figure 8:
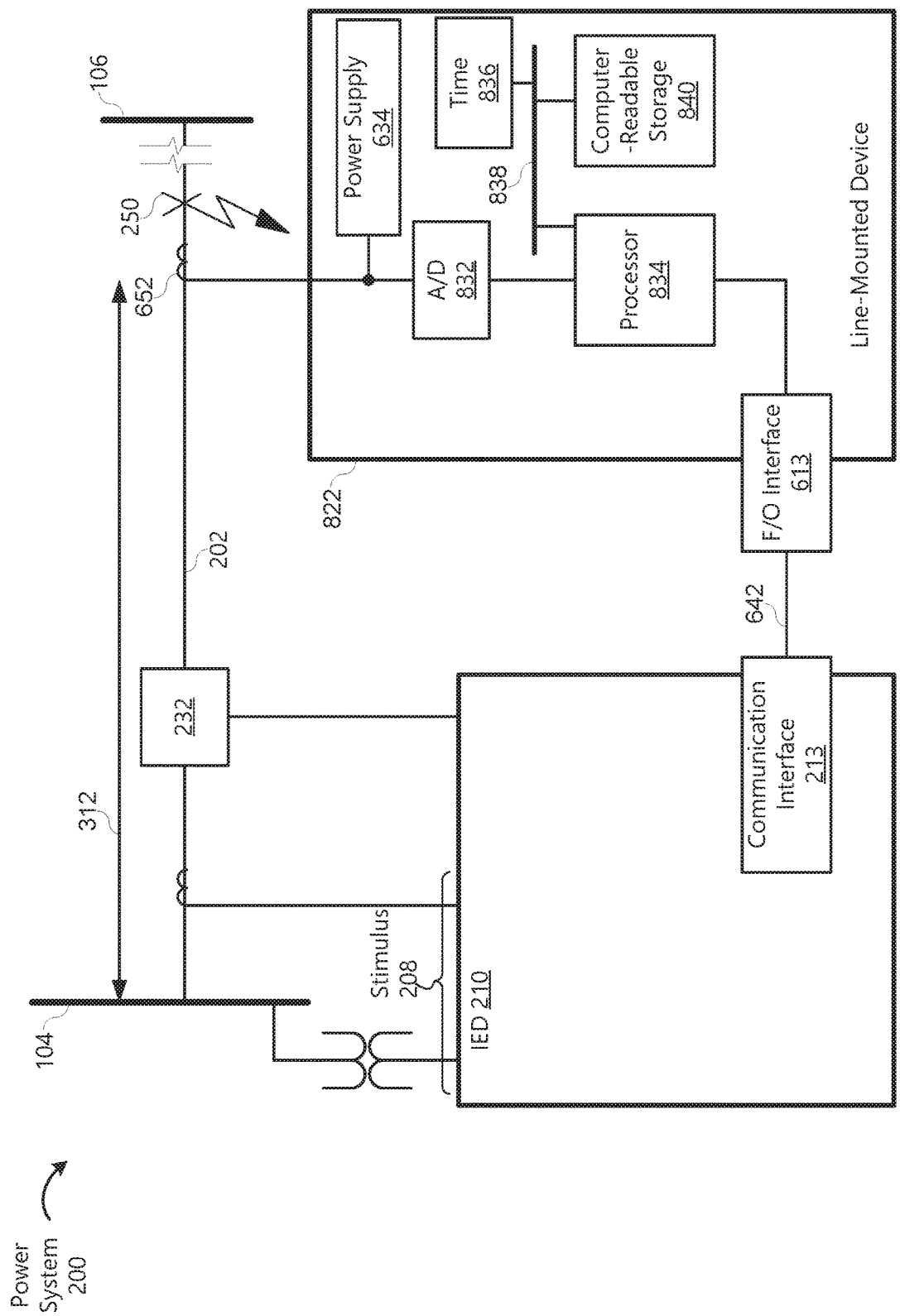
FIG. 8 illustrates a simplified block diagram of a system for locating a fault using signals from an IED and a digital line-mounted device.

FIG. 8 illustrates a simplified block diagram of another system for determining a location of a fault using signals available from instrument transformers and traveling wave principles. Signals from CT 652 may be sampled and digitized using A/D converter 832. The digitized analog signals from the A/D converter 832 may be provided to a processor 834. Various components such as a time source 836, processor 834, and computer-readable storage media 840, may be in communication either directly or using additional components, via bus 838.

The time source 836 may be any applicable time source such as a crystal oscillator, temperature-compensated crystal oscillator, or the like, or may obtain a time signal from a common time source such as a global navigational satellite system (GNSS), WWB signal, WWWB signal, or the like, or even a time signal distributed over a common network using, for example, IEEE-1588, NTP, SNTP, or the like.

The computer-readable storage media 840 may be a repository of various computer instructions for execution on the processor 834 to cause the line-mounted device to perform certain functions. The instructions may include instructions that when executed cause the line-mounted device 822 to determine a traveling wave occurrence, time, and polarity using the digitized analog signals. Upon such determination, the processor may format a communication including the traveling wave properties, and cause the communication to be sent to the IED 210 via fiber-optic media 642 using the fiber-optic interface 613. Although the embodiment is described using a processor and instructions stored on computer-readable media, any such processing mechanism may be used to perform the tasks. For example a field-programmable gate array (FPGA) with resident instructions may be used. An application-specific integrated circuit (ASIC) or the like may be used. In another embodiment, the instructions may, when executed, cause the line-mounted device 822 to obtain, format, and transmit current measurements to the IED 210 via interface 613 for use by the IED to determine traveling wave properties.

Furthermore, a known time delay from the CT 652 through receipt of the communication at the communication interface 213 of the IED may be known. The IED 210 may be configured to use the communicated information related to the detected traveling wave and the known time delay to determine when the traveling wave passed CT 652, and use this along with the polarity to determine the location of the fault as described above.

In one embodiment the line-mounted device may process the digitized analog signals to determine the traveling wave information and communicate the traveling wave information to the IED 210. In another embodiment, the line-mounted device may continue monitoring the electric power delivery system and transmit information related to further reflections of the traveling wave to the IED 210. In yet other embodiments, the line-mounted device may constantly transmit the digitized analog information from the A/D converter to the IED 210 for processing by the IED 210 to detect traveling waves and traveling wave information therefrom. In yet another embodiment, the line-mounted device may be configured to detect the traveling wave and, upon detection may transmit the communication with traveling wave information and start a continuous stream of digitized analog signals from the A/D to the IED 210. Variations of such transmissions are also contemplated. Power system information may be transmitted continuously or only upon detection of a fault by the line-mounted device.

Figure 9:
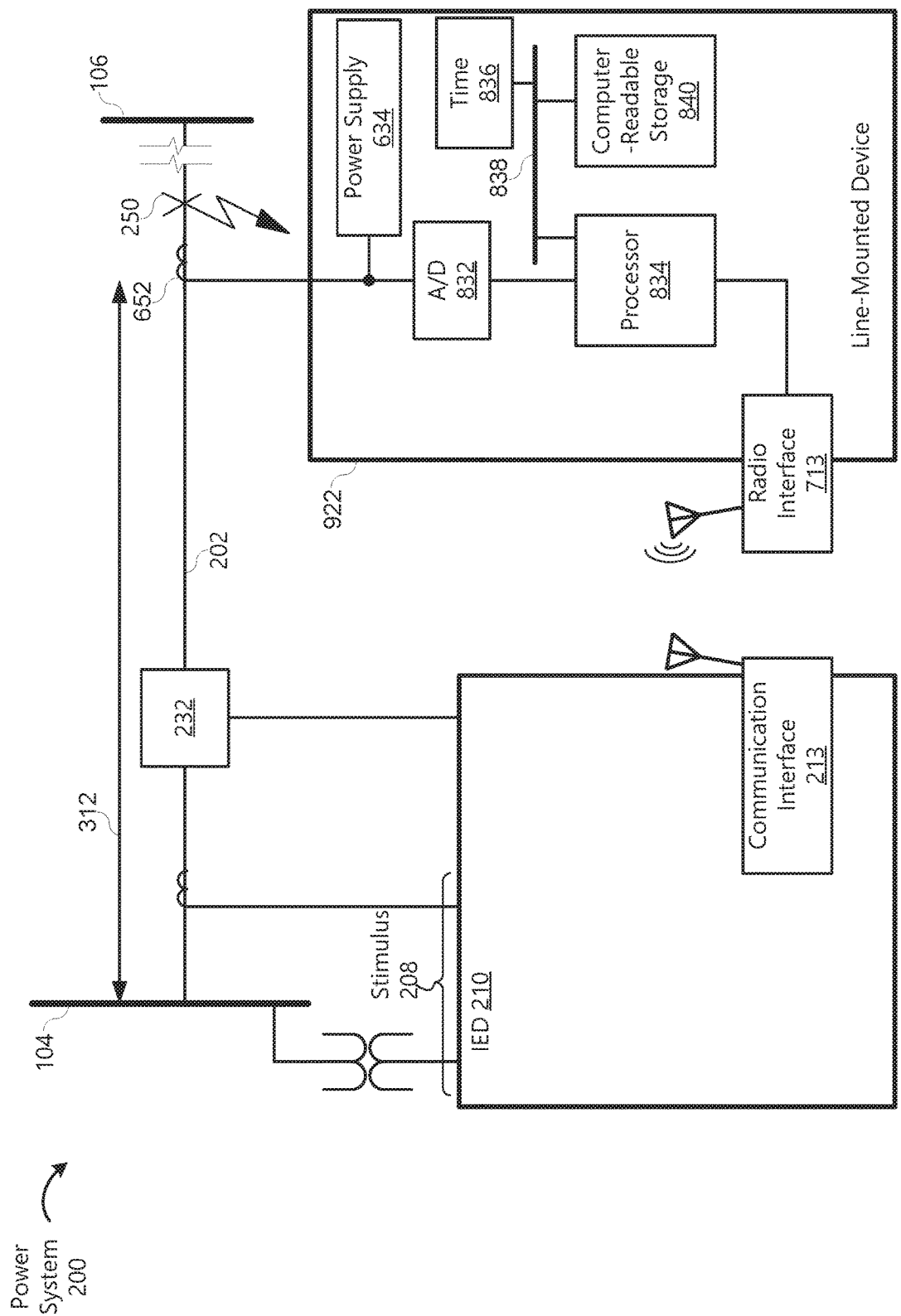
FIG. 9 illustrates a simplified block diagram of a system for locating a fault using signals from an IED and a digital line-mounted device.

FIG. 9 illustrates a simplified block diagram of yet another system, similar to that of FIG. 8, except that communications from a line-mounted device 922 are provided to IED 210 using a radio interface 713 and radio-frequency signal.

Referring back to the several embodiments described and illustrated in FIGS. 6-9 the line-mounted device may persist in a sleep or low-power mode during nominal operation of the electric power system. In this mode, the line-mounted device may not send communications to the IED 210, or only periodically send communications or heart-beat signals indicating that the line-mounted device has not detected a fault. During this low-power mode, the line-mounted device may obtain and store electric power using the power supply 634 for ready use when needed. The line-mounted device may include a circuit for detecting a current surge and initiate an active mode. During the active mode, the line-mounted device may transmit communications to the IED 210. For example, the analog embodiments illustrated in FIGS. 6 and 7 may start transmitting the modulated signal to IED 210; the digital embodiments illustrated in FIGS. 8 and 9 may start processing the digitized analog signal as described above and transmitting communications upon entering active mode (detection of a fault).

The power supply 634 may include a power storage device with sufficient capacity to power the various components of the line-mounted device 922 during a time period sufficient to detect and communicate information related to the fault. In one embodiment, the power storage may be a capacitor of sufficient size to power the various components of the line-mounted device 922 for at least the time it would take a traveling wave to transverse the power line four times. This would be sufficient to detect the first occurrence of the traveling wave, the reflection from the location of the IED, and the reflection from the fault location, even if the fault occurred at the other end of the line.

Figure 10:
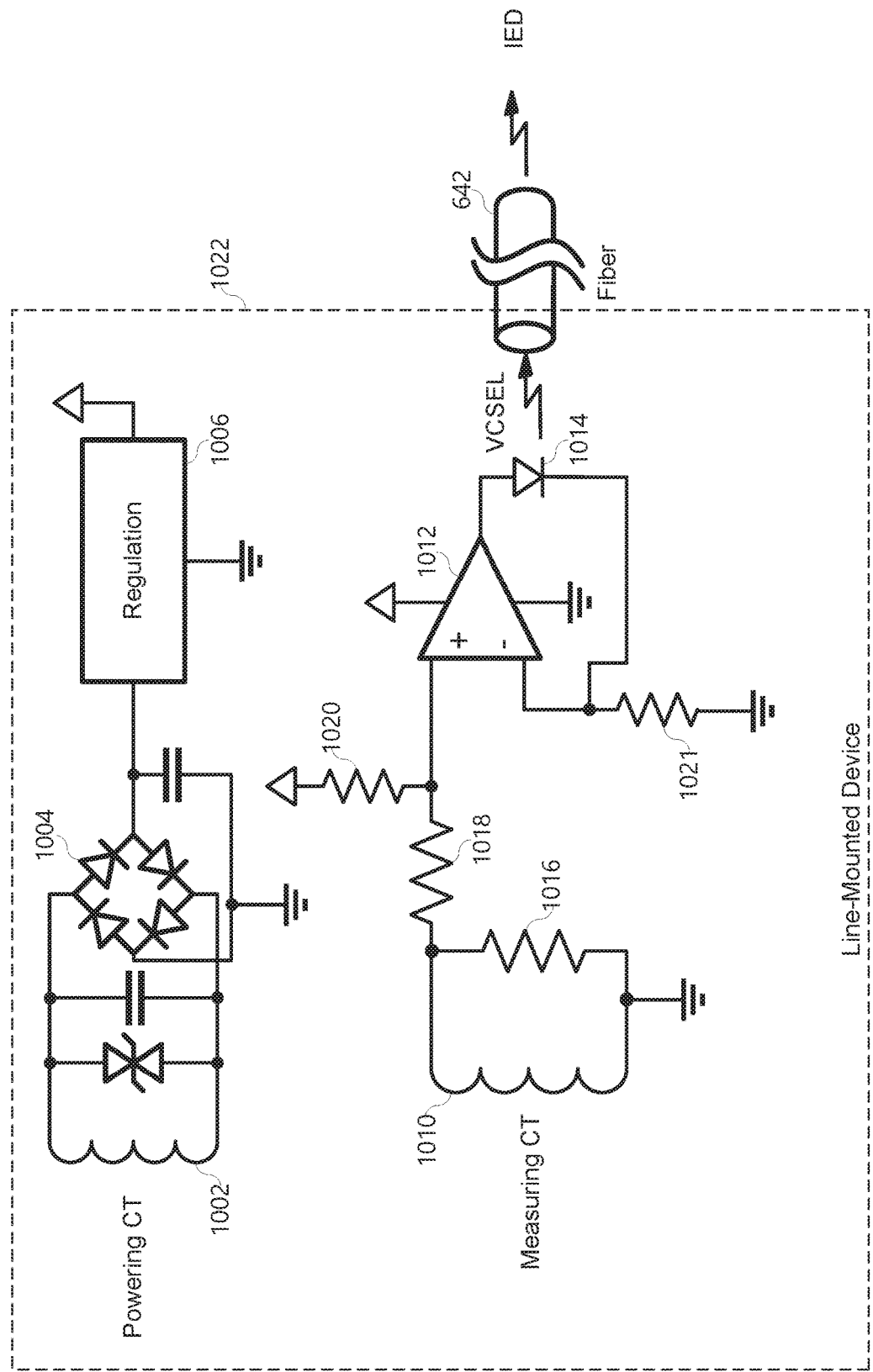
FIG. 10 illustrates a simplified circuit diagram of a system for powering a line-mounted device and transmitting direct waveform over fiber.

FIGS. 10-14 illustrate circuit diagrams of several embodiments of a line-powered, line-mounted device for sending information to an IED for fault location. FIG. 10 illustrates a simplified circuit diagram for providing power and transmitting analog signals proportional to the current via fiber optic media 642. The illustrated embodiment uses direct waveform transfer over fiber optic media. A first powering CT 1002 may be in electrical communication with a rectifier 1004 for rectifying alternating current to direct current for regulator 1006. Regulated electric power is supplied to the various components of the line-mounted device 1022. Measuring CT 1010 produces a scaled version of the current in the power line that it is mounted on. Resistor 1016 provides a path for the scaled current and produces a voltage that is scaled to the current. The resistance of 1016 when compared to the sum of the resistances of 1018 and 1020 is small enough that the voltage measured relative to ground at the node common to 1016 and 1018 is nearly symmetrical about ground, i.e. there is little DC current through the coil of measuring CT 1010. The node common to resistor 1020 and resistor 1018 is the source of a voltage for the + terminal of op amp 1012. This voltage is a representation of the current in resistor 1016 with the addition of a DC voltage. The purpose of this DC voltage is to have op amp 1012 always bias the optical component 1014 such that it produces light for all anticipated current levels in resistor 1016, including the negative currents. Resistor 1021 converts the current through the optical component 1014 to a voltage such that the op amp 1012 may drive the current through the optical device as a scaled representation of the voltage at the + terminal of op amp 1012. Light source (e.g. a light-emitting diode, vertical-cavity surface-emitting laser (VCSEL) 1014, or the like) may emit a signal onto media 642 that is a scaled version of the current in line.

Figure 11:
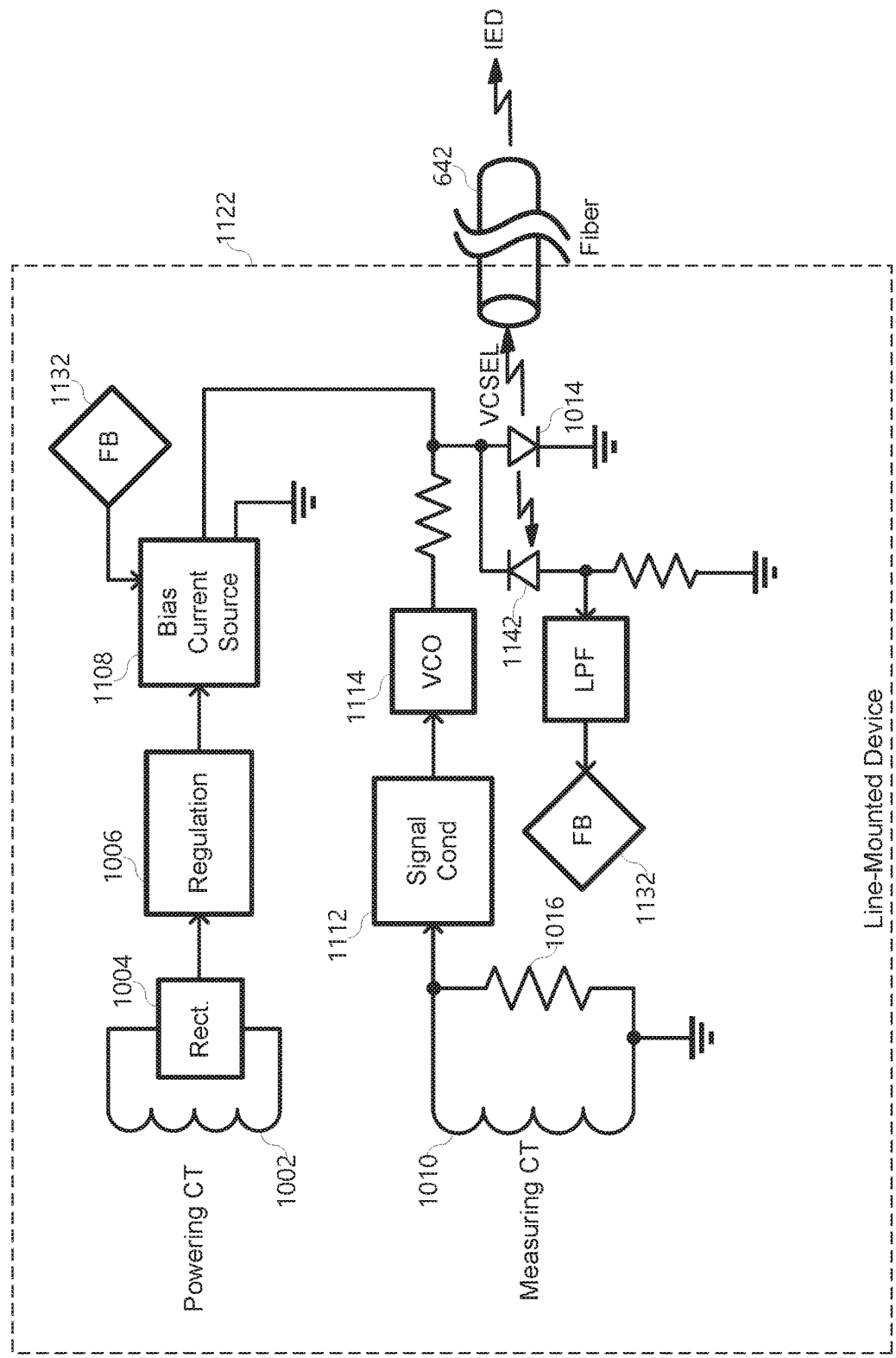
FIG. 11 illustrates a simplified circuit diagram of a system for powering a line-mounted device and transmitting an analog signal over fiber.

FIG. 11 illustrates another simplified circuit diagram useful for providing a continuous frequency-modulated signal corresponding to the current at the line-mounted device 1122. A rectified and regulated power signal is provided to the bias current source 1108, in addition to providing power to the components of the line-mounted device 1122. The current signal from the measuring CT 1010 is conditioned using signal conditioner 1112 and provided to a voltage-controlled oscillator (VCO) 1114, which drives the light source 1014 for providing the frequency-modulated light signal to the IED via fiber 642. Bias current from the source 1108 pushes operation of the light source 1014 above its threshold current to allow for negative transitions of the VCO 1114 without turning off the light source 1014. Further, a feedback signal 1132 is produced using a low-pass filtered signal representing the current in the VCSEL, and used by the bias current source to adjust the bias current to a predetermined value. The signal entering the low pass filter may be produced by a light monitoring device 1142 that is optically coupled to the VCSEL. Accordingly, an analog frequency modulated signal corresponding to current is continuously provided via fiber optics to the IED for use to determine a fault location using traveling wave properties as disclosed above.

Figure 12A:
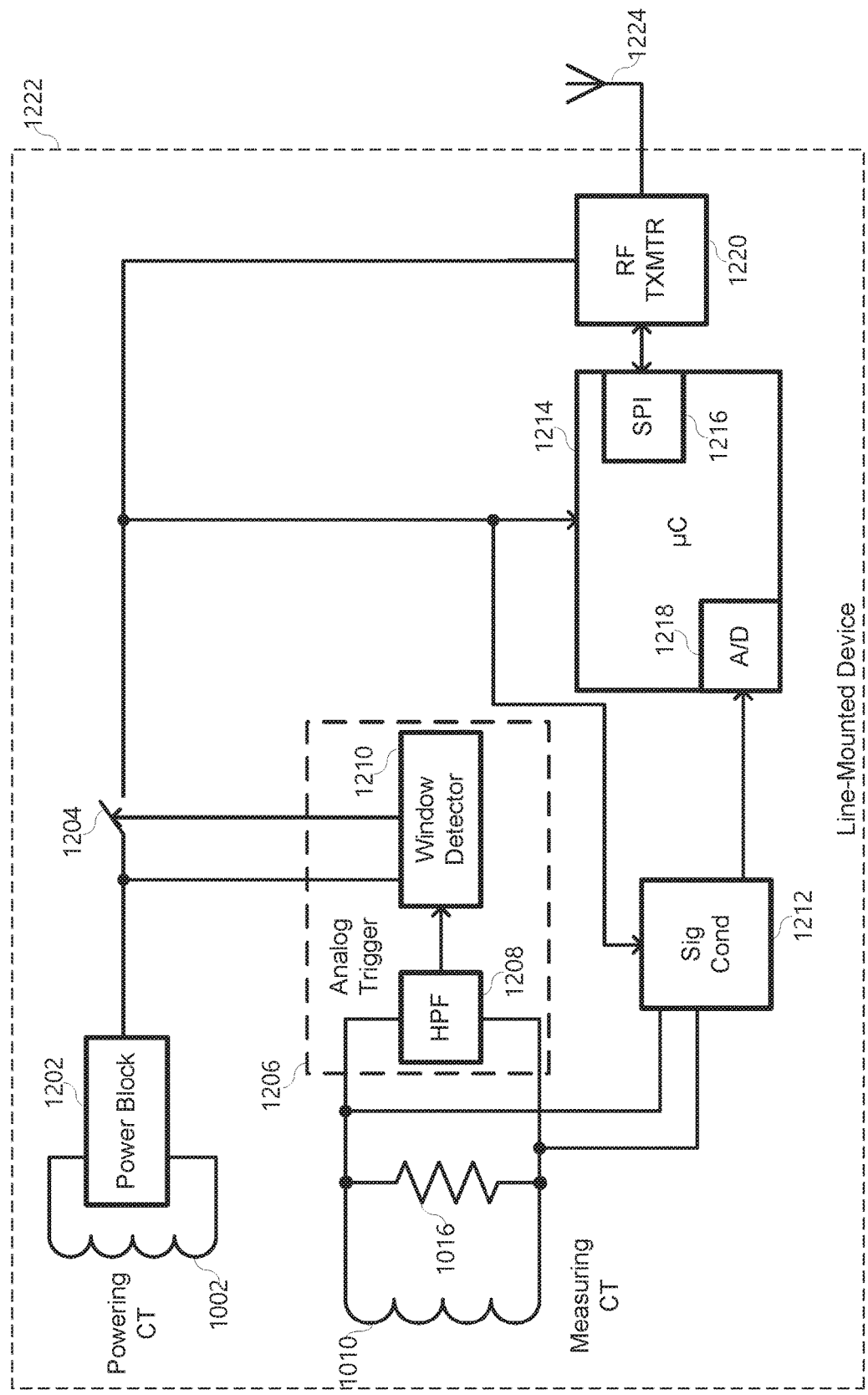
FIG. 12A illustrates a simplified circuit diagram of a system for powering a line-mounted device and transmitting over radio frequency.

FIG. 12A illustrates another simplified circuit diagram useful for providing power system measurements using radio-frequency transmission upon fault detection. The powering CT 1002 provides current to a power block 1202 that may include the various elements necessary for providing rectified DC power to components of the line-mounted device 1222 as described above (such elements may include, for example, surge suppressor, maximizing capacitor, energy storage, buck converter, and the like). Such power may be selectively supplied using a switch 1204 operated by an analog trigger 1206. The analog trigger 1206 receives a signal from the measuring CT 1010 representative of current of the power system. A high-pass filter 1208 may be used to filter out signals at the nominal frequency (e.g. 60 Hz or 50 Hz, depending on the power system). The remaining signal is between upper and lower thresholds of a window detector 1210. Upon crossing either threshold, the window detector 1210 closes switch 1204 to power the signal conditioning 1212, processor 1214, and transmitter 1220 for transmission of the digitized analog signals to the IED.

Signal conditioning 1212 may include an anti-alias filter and signal gain. A conditioned signal representative of current is provided to a microprocessor 1214 for conversion of the analog signal into a digitized signal, storage, and transmission to the IED. The microprocessor may include (or be associated with) an analog-to-digital converter (A/D) 1218 for sampling and digitizing the analog input. The microprocessor may include (or be associated with) an interface such as a serial peripheral interface (SPI) 1216 for transmitting the digital signal to the RF transmitter 1210 and transmission to the IED via the radio media 1224. Accordingly, the line-mounted device may store information about a detected fault upon detection of the fault, and transmit the stored information via radio-frequency to the IED.

Figure 12B:
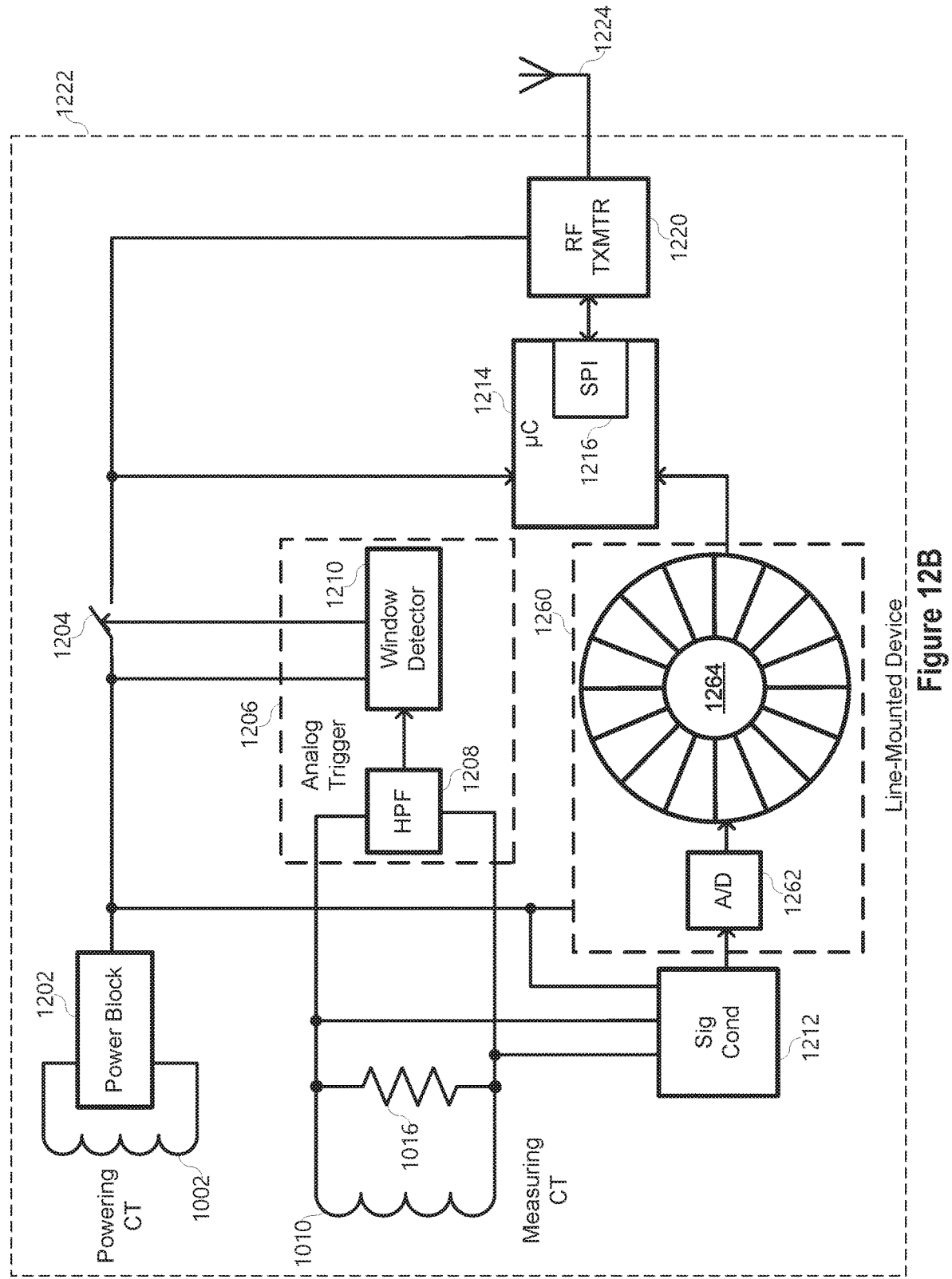
FIG. 12B illustrates a simplified circuit diagram of a system for powering a line-mounted device, collecting samples, and transmitting over radio frequency.

FIG. 12B illustrates a simplified circuit diagram useful for digitizing and buffering power system information and sending the digitized power system information to an IED upon detection of a fault, similar to the embodiment illustrated in FIG. 12A. An A/D and buffer component 1260 continuously receives electric power from the power block 1202. The conditioned signal from 1212 is sampled and digitized using A/D 1262, with the samples being stored in a circular buffer 1264. The buffer 1264 is available to the microprocessor 1214 such that upon detection of a fault by the analog trigger 1206, closing of the switch 1204, the processor may obtain the samples stored in buffer 1264 for transmission. The processor 1214 may be configured to transmit samples from immediately before and during the occurrence of the fault. In certain embodiments, the processor 1214 may continue to send samples from the buffer for a time period following the fault detection. Accordingly, a circular buffer may be used to obtain power system measurements before and during a fault, and transmitted to an IED via radio frequency upon detection of the fault.

Figure 13:
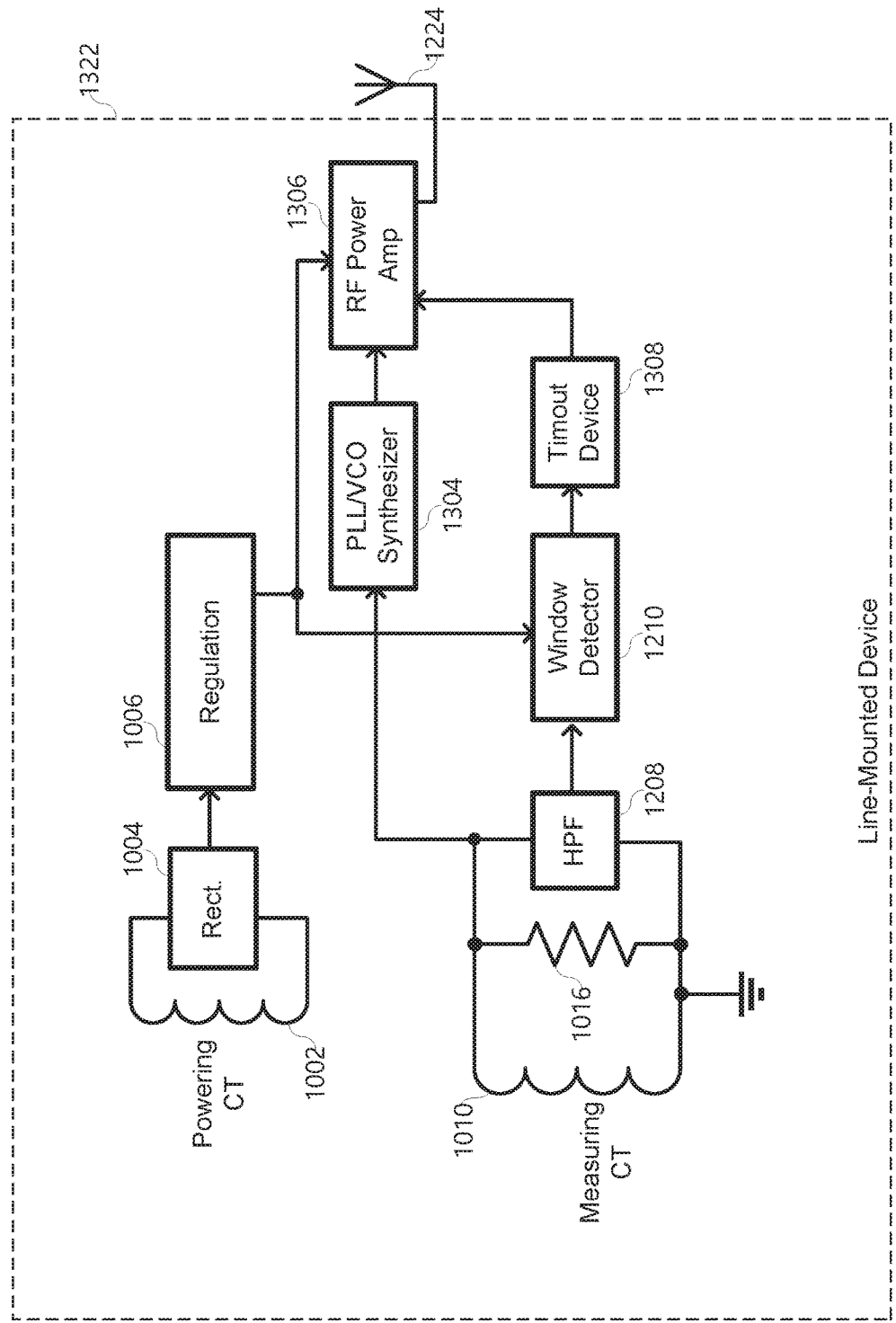
FIG. 13 illustrates a simplified circuit diagram of a system for powering a line-mounted device and transmitting analog signals over radio frequency.

FIG. 13 illustrates a simplified circuit diagram for transmitting an analog signal corresponding with the current via radio frequency. The embodiment illustrated may only periodically transmit upon detection of a condition under which the signal should be transmitted. A powering CT 1002 obtains a power signal from a power system for rectification 1004 and regulation 1006, to provide operating power to various components of the line-mounted device 1322. Measuring CT 1010 obtains a current secondary, which is converted to a voltage signal in resistor 1016 The signal is provided to a phase-locked loop (PLL) voltage controlled oscillator (VCO) synthesizer 1304 for providing a modulated signal related to current on the power system to the radio-frequency power amplifier 1306. The line-mounted device 1322 is, accordingly, continuously ready to transmit pending enablement of the power amplifier 1306. The filtered signal from filter 1208 is provided to a window detector 1210 operating as described above. Upon assertion of the window detector 1210, the timeout device 1308 provides an enable signal to the power amplifier 1306 allowing RF transmission of the signal for a predetermined time associated with the timeout device 1308. Accordingly, analog power system signals are sent to the IED via RF by the line-mounted device 1322 only upon detection of a fault.

Figure 14:
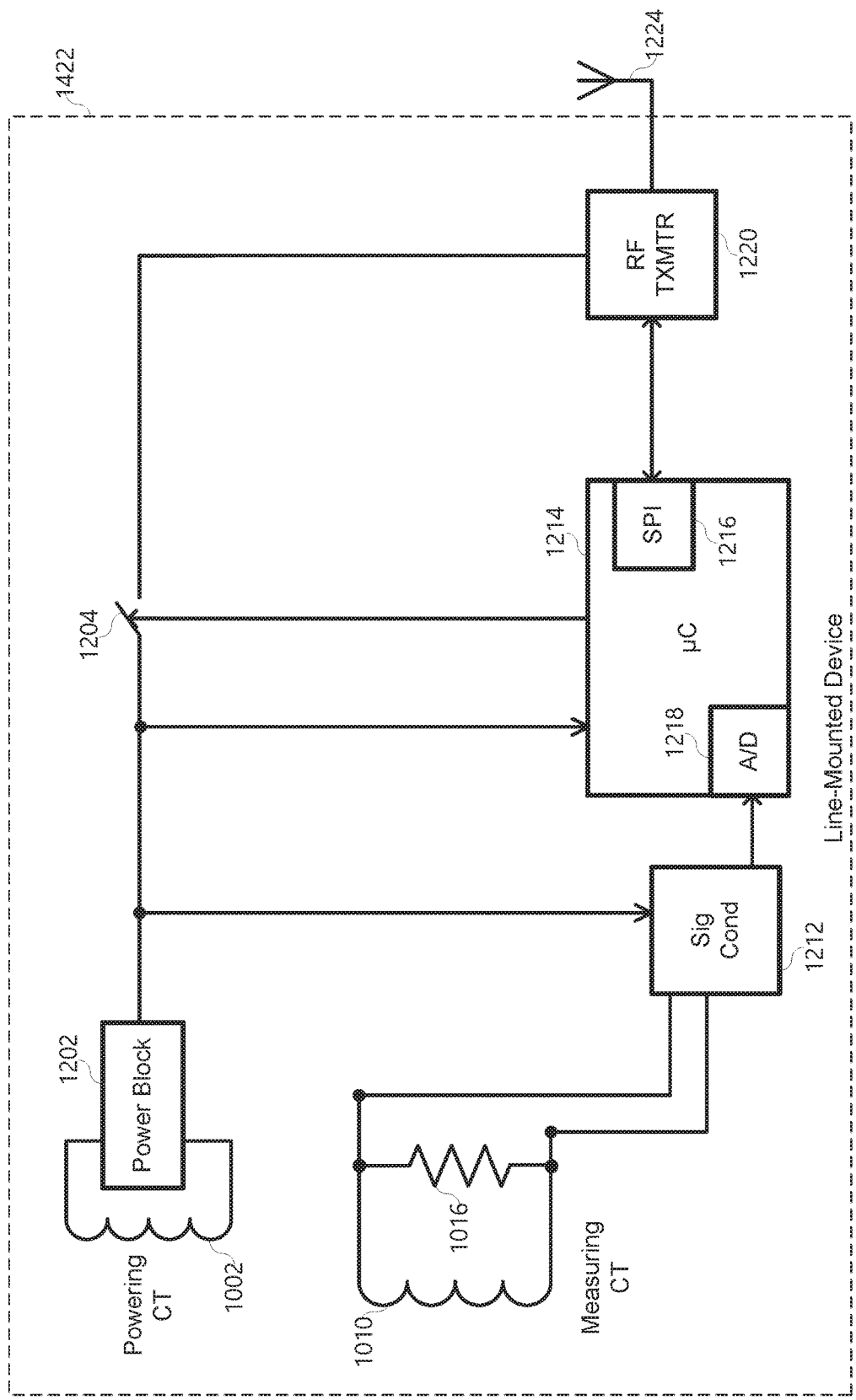
FIG. 14 illustrates a simplified circuit diagram of a system for powering a line-mounted device and transmitting continuous digital capture over radio frequency.

FIG. 14 illustrates a simplified circuit diagram for continuous digital capture and periodic transmission via radio frequency from line-mounted device 1422 to an IED. As illustrated, regulated power is continuously provided from the power block 1202 to the microcontroller 1214, which continuously obtains, samples, digitizes, and stores measurements related to current on the power system from measuring CT 1010. The measurements may be stored in a buffer (such as a circular buffer 1262). The microprocessor 1214 may also use the digitized samples to determine occurrence of a fault. The determination may be made by comparing a current magnitude against predetermined thresholds. The determination may be made using frequency of the signal. In alternative embodiments, an analog trigger may be used, such as the high-pass filter and window detector described in FIGS. 12A, 12B and 13. Upon detection of a fault, the microprocessor 1214 may signal switch 1204 to close, providing power to the radio-frequency transmitter 1220. The microprocessor 1214 may further be configured to output the stored measurements to the transmitter 1220 using, for example, the SPI 1216. Accordingly, digital signals related to current on the power system may be continuously stored and periodically transmitted by the line-mounted device 1422 to an IED for use in determining a location of a fault as described above.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to detect a location of a fault on an electric power delivery system, comprising:
    a line-mounted device at a first location on the electric power delivery system, including:
        a power supply to provide operating power to the line-mounted device;
        a current transformer in electrical communication with the electric power delivery system at the first location to obtain an electrical signal related to a current at the first location;
        a signal processor in communication with the current transformer to receive the electrical signal and provide first location current measurements; and,
        a transmitter in communication with the signal processor, configured to transmit first location current measurements;
    a protective device in electrical communication with a second location on the electric power delivery system, the first location a known distance from the second location, the protective device including;
        a communication interface in communication with the transmitter of the line-mounted device to receive the first location current measurements;
        a stimulus input obtaining electric power system signals from the second location;
        a signal processor to process the electric power system signals from the stimulus input;
        a traveling wave detector in communication with the signal processor and the communication interface to:
            using the first location current measurements, determine a time and polarity of a traveling wave at the first location; and
            determine a time and polarity of a traveling wave at the second location; and
        a fault locator in communication with the traveling wave detector to determine a location of a fault using the times and polarities of the traveling waves at the first and second locations.

2. The system of claim 1, wherein the traveling wave detector is configured to calculate a voltage of the traveling wave at the second location using the first location current measurements and a known impedance.

3. The system of claim 1, wherein the transmitter comprises a fiber-optic transmitter.

4. The system of claim 1, wherein the transmitter comprises a radio-frequency transmitter.

5. The system of claim 1, wherein the power supply is in electrical communication with a powering current transformer in electrical communication with the electric power delivery system.

6. The system of claim 5, wherein the power supply comprises a rectifier to rectify an alternating-current from the electric power delivery system to a direct-current for use by the line-mounted device.

7. The system of claim 1, wherein the fault locator determines a location of the fault within the known distance between the first location and the second location when the polarity of the traveling wave at the first location is opposite of the polarity of the traveling wave at the second location.

8. The system of claim 1, wherein the fault locator determines a location of the fault outside of the known distance between the first location and the second location when the polarity of the traveling wave at the first location is the same as the polarity of the traveling wave at the second location.

9. The system of claim 8, wherein the fault locator determines a location of the fault on the same line as the line-mounted device when the time of the traveling wave at the second location is after the time of the fault at the first location.

10. The system of claim 8, wherein the fault locator determines a location of the fault on a different line than the line-mounted device when the time of the traveling wave at the second location is before the time of the fault at the first location.

11. The system of claim 9, wherein the fault locator determines a distance to the fault using traveling waves detected using the electric power system signals from the second location.

12. The system of claim 1, wherein the signal processor of the line-mounted device comprises a modulator.

13. The system of claim 1, wherein the signal processor of the line-mounted device comprises a phase-locked loop and a voltage-controlled oscillator.

14. The system of claim 1, wherein the signal processor of the line-mounted device comprises:
    an analog-to-digital converter to sample and digitize the electrical signal from the current transformer; and
    a buffer to store the digitized electrical signal.

15. The system of claim 14, wherein the transmitter is configured to continuously transmit the stored digitized electrical signal.

16. The system of claim 14, further comprising an analog trigger to determine a fault and initiate transmission of the stored digitized electrical signal.

17. A method for calculating a location of a fault in an electric power delivery system, comprising:
    detecting a first observation of a traveling wave at a first location on the electric power delivery system, the first observation including a first polarity of the first observation of the traveling wave;
    detecting a second observation of the traveling wave at a second location on the electric power delivery system using electric power delivery system signals obtained using a line-mounted device at a predetermined distance from the first location, the second observation including a second polarity of the second observation of the traveling wave; and
    determining that a location of the fault is between the first location and the second location when the first polarity is opposite of the second polarity.

18. The method of claim 17, further comprising determining that the location of the fault is not between the first location and the second location when the first polarity is equal to the second polarity.

19. The method of claim 18, further comprising:
   determining that the location of the fault is on a power line that is the same line as the second location when a time of the second observation is before a time of the first observation; and
   determining that the location of the fault is on a power line that is different from the line of the second location when the time of the second observation is after a time of the first observation.

20. The method of claim 17, further comprising the line-mounted device modulating the electric power delivery system signals and transmitting the modulated signal to an intelligent electronic device at the first location.

21. The method of claim 17, further comprising the line-mounted device sampling and digitizing the electric power delivery system signals, and transmitting the digitized signals to an intelligent electronic device at the first location.

22. The method of claim 17, further comprising the line-mounted device continuously transmitting electric power delivery system signals to an intelligent electronic device at the first location.

23. The method of claim 17, further comprising the line-mounted device periodically transmitting electric power delivery system signals to an intelligent electronic device at the first location upon detection of a fault.

24. A method for calculating a location of a fault in an electric power delivery system, comprising:
   detecting a first observation of a traveling wave at a first location on the electric power delivery system, the first observation of the traveling wave including a sum of incident and reflected traveling waves at a terminal of the electric power delivery system;
   detecting a second observation of the traveling wave at a second location on the electric power delivery system using electric power delivery system signals obtained using a line-mounted device at a predetermined distance from the first location, the second observation including current at the second location; and
   calculating a traveling wave characteristic at the first location using the current at the second location and a known system impedance; and,
   calculating a distance to the fault using the calculated traveling wave characteristic.

25. The method of claim 24, further comprising:
   detecting, at the first location, a time of arrival of a reflection of the traveling wave from the fault;
   wherein the traveling wave characteristic comprises a time of arrival of the traveling wave at the first location; and
   wherein the step of calculating the distance to the fault uses a traveling wave propagation speed and a time difference between the time of arrival of the traveling wave at the first location and the time of arrival of the reflection of the traveling wave from the fault.

* * * * *